(12) United States Patent
Kim

(10) Patent No.: US 7,767,533 B2
(45) Date of Patent: Aug. 3, 2010

(54) METHOD AND DEVICE FOR PROVIDING A CONTACT STRUCTURE

(75) Inventor: Yong-Il Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/457,142

(22) Filed: Jun. 2, 2009

(65) Prior Publication Data

US 2009/0298247 A1 Dec. 3, 2009

(30) Foreign Application Priority Data

Jun. 2, 2008 (KR) .................... 10-2008-0051637

(51) Int. Cl.
*H01L 21/336* (2006.01)

(52) U.S. Cl. ............... 438/294; 438/597; 257/E21.409; 257/E21.432

(58) Field of Classification Search .............. 438/294, 438/597; 257/E21.409, E21.432
See application file for complete search history.

(56) References Cited

U.S. PATENT DOCUMENTS

| 6,297,117 | B1 * | 10/2001 | Yu ........................... 438/305 |
| 6,445,050 | B1 | 9/2002 | Chediak et al. |
| 6,946,376 | B2 * | 9/2005 | Chediak et al. ............. 438/586 |
| 2007/0057324 | A1 * | 3/2007 | Tews et al. ................... 257/347 |
| 2008/0164528 | A1 * | 7/2008 | Cohen et al. ................ 257/365 |

FOREIGN PATENT DOCUMENTS

| JP | 2001-267421 A | 9/2001 |
| KR | 10-2001-0077992 A | 8/2001 |
| KR | 10-2006-0070066 A | 6/2006 |
| KR | 10-2007-0063810 A | 6/2007 |

* cited by examiner

*Primary Examiner*—Charles D Garber
*Assistant Examiner*—Stanetta D Isaac
(74) *Attorney, Agent, or Firm*—Lee & Morse, P.C.

(57) ABSTRACT

An approach is provided for semiconductor devices and methods for providing a contact structure. Methods may include forming a gate pattern on a substrate including a device isolation pattern provided to define an active region, the gate pattern crossing over the active region and being disposed on the device isolation pattern, and forming a first doped region and a second doped region in the active region adjacent to opposite sides of the gate pattern, respectively. The methods may include sequentially forming a gate spacer and a sacrificial spacer on both sidewalls of the gate pattern, forming an interlayer dielectric on the entire surface of the substrate, planarizing the interlayer dielectric to expose the gate spacer and the sacrificial spacer, removing a portion of the sacrificial spacer to form a groove to expose the first doped region, and forming a contact structure in the groove.

11 Claims, 25 Drawing Sheets

APPENDIX A

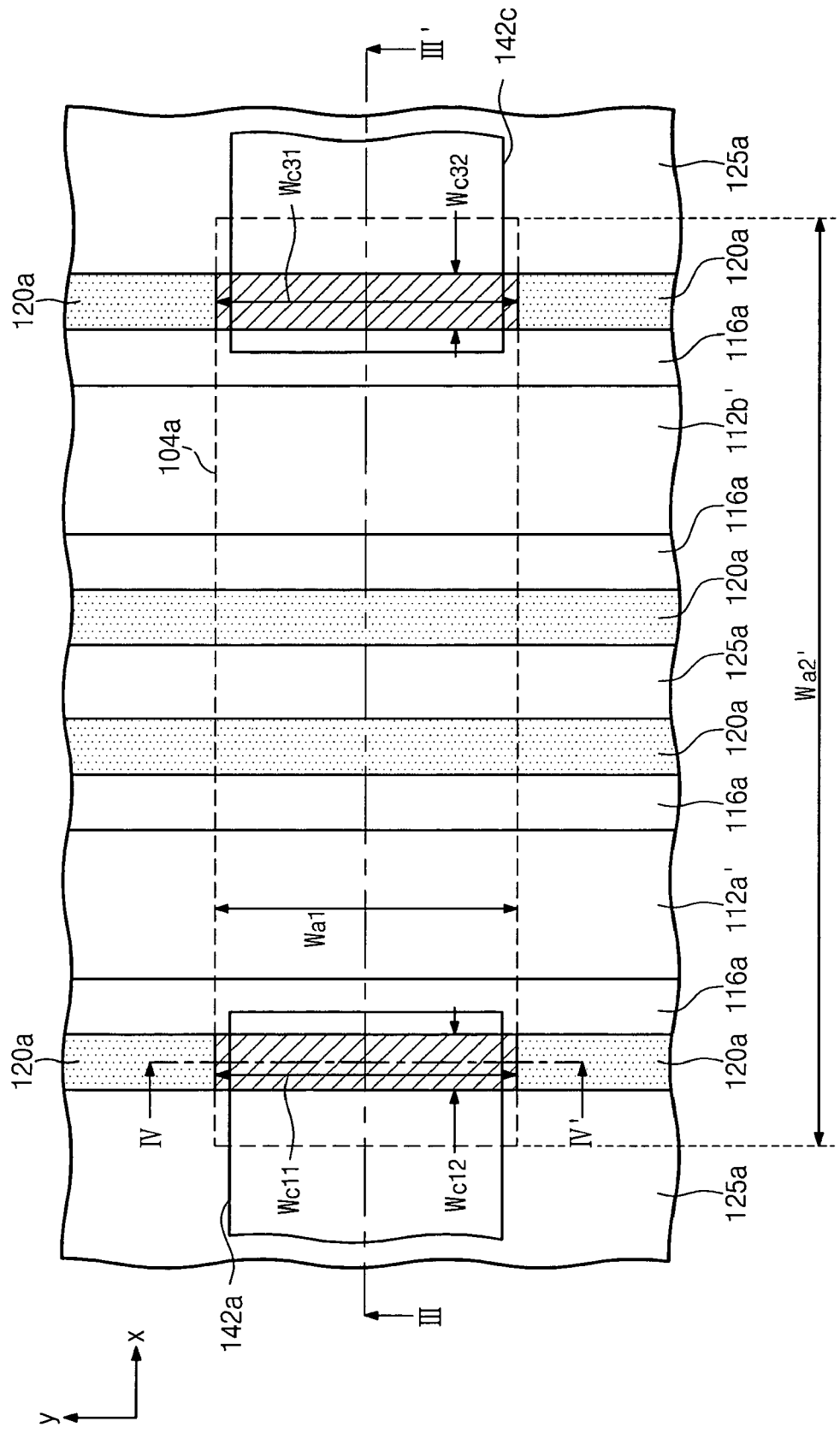

METHOD AND DEVICE FOR PROVIDING A CONTACT STRUCTURE

RELATED APPLICATIONS

This application claims benefits of the earlier filing date under 35 U.S.C. §119 of Korean Patent Application No. 10-2008-0051637, filed on Jun. 2, 2008, the entirety of which is herein incorporated by reference.

FIELD OF THE INVENTION

Various exemplary embodiments of the invention relate to devices and manufacturing methods, and more specifically, to a semiconductor device providing a contact structure and processing of forming the contact structure.

BACKGROUND

Semiconductor devices are electronic components that exploit the electronic properties of semiconductor materials, principally silicon, germanium and gallium arsenide. These devices for example, can be classified into memory devices to store data and logic devices to operate data or execute predetermined commands for the applications of electronic components. Memory devices may further be classified into volatile memory devices and nonvolatile memory devices. Characteristics of the volatile memory devices lose their stored data when their power supplies are interrupted, while nonvolatile memory devices retain their stored data even when their power supplies are interrupted. Volatile memory devices include DRAM (Dynamic Random Access Memory) devices and SRAM (Static Random Access Memory) devices, and nonvolatile memory devices include flash memory devices, phase-changeable memory devices, and magnetic RAM (MRAM) devices.

To promote greater adoption, the semiconductor industry, from manufacturers to vendors, has agreed at great expense and effort to develop process of manufacturing devices toward miniaturization, multi-functionalization and/or high speed that underlie the semiconductor devices are increasingly becoming significant in electronic industries. With the advance in electronic industries, there are ever-increasing demands for high integration density, multi-functionalization, high speed, reproducibility and/or high reliability of semiconductor devices. It is recognized that traditional approaches do not adequately address the demands because trade-off may arise between these characteristics, there may be difficulty in satisfying all the demands. For example, decrease in feature size and/or distance of semiconductor patterns may make it difficult to increase operation speed of semiconductor devices and achieve reliability and/or reproducibility of semiconductor devices. Consequently, this negatively impacts to satisfy various requirements for semiconductor devices.

Therefore, there is a need for providing a contact structure effectively to support low resistance and high speed of devices yet achieving reliability and reproducibility when processing.

SUMMARY

Some embodiments of the present invention provide a semiconductor device including a contact structure. the semiconductor device may include a device isolation pattern disposed on a substrate to define an active region; a gate pattern crossing over the active region and disposed on the device isolation pattern; a first doped region and a second doped region formed in the active region adjacent to opposite sides of the gate pattern, respectively; gate spacers disposed on both sidewalls of the gate pattern, respectively; an interlayer dielectric laterally spaced apart from the gate spacer and disposed on the substrate; a sacrificial spacer interposed between the interlayer dielectric and the gate spacer disposed on the device isolation pattern, the sacrificial spacer including an insulating material having an etch selectivity with respect to the gate spacer and the interlayer dielectric; and a contact structure disposed in a groove surrounded by the gate spacer, the sacrificial spacer and the interlayer dielectric to be in contact with the first doped region, the contact structure exhibiting the shape of a bar extending in a longitudinal direction of the gate pattern.

Some embodiments of the present invention provide a method for forming a semiconductor device including a contact structure. The method may include forming a gate pattern on a substrate including a device isolation pattern provided to define an active region, the gate pattern crossing over the active region and being disposed on the device isolation pattern; forming a first doped region and a second doped region in the active region adjacent to opposite sides of the gate pattern, respectively; sequentially forming a gate spacer and a sacrificial spacer on both sidewalls of the gate pattern; forming an interlayer dielectric on the entire surface of the substrate; planarizing the interlayer dielectric to expose the gate spacer and the sacrificial spacer; removing a portion of the sacrificial spacer to form a groove to expose the first doped region; and forming a contact structure in the groove.

In some embodiments, the forming the groove may include forming a mask pattern with an opening on the substrate, the opening being provided to expose a portion of the sacrificial spacer disposed on the first doped region and the mask pattern covering another portion of the sacrificial spacer disposed on the device isolation pattern; and removing the exposed portion of the sacrificial spacer by using the mask pattern as an etch mask.

In some embodiments, the opening may have a first width in a longitudinal direction of the gate pattern, and the first width of the opening may be equal to a width of the active region, where the first doped region is formed, in the longitudinal direction.

In some embodiments, the opening may have a second width in a latitudinal direction that is perpendicular to the longitudinal direction of the gate pattern, and the second width of the opening may be greater than a width of the sacrificial spacer in the latitudinal direction. The opening may further expose a portion of the gate spacer and a portion of the planarized interlayer dielectric adjacent to both sides of the exposed portion of the sacrificial spacer.

In some embodiments, the mask pattern may cover yet another portion of the sacrificial spacer disposed on the second doped region.

In some embodiments, the method may further include removing another portion of the sacrificial spacer disposed on the second doped region to form a second groove to expose the second doped region; and forming a second contact structure in the second groove.

In some embodiments, the forming the first groove to expose the first doped region and the second groove to expose the second doped region may include forming a mask pattern with an opening on the substrate, the opening being provided to expose a portion of the sacrificial spacer disposed on the first doped region and another portion of the sacrificial spacer disposed on the second doped region, and the mask pattern covering yet another portion of the sacrificial spacer on the device isolation pattern; and removing the exposed portions of the sacrificial spacer by using the mask pattern as an etch mask.

In some embodiments, the sacrificial spacer may include an insulating material having an etch selectivity with respect to the gate spacer and the interlayer dielectric.

In some embodiments, the gate pattern may include a gate electrode and a capping insulating pattern that are sequentially stacked; an upper portion of the gate spacer, an upper portion of the sacrificial spacer, and an upper portion of the capping insulating pattern may be planarized when the interlayer dielectric is planarized; and the sacrificial spacer may include an insulating material having an etch selectivity with respect to the gate spacer, the interlayer dielectric, and the capping insulating pattern.

In some embodiments, the method may further include before forming the sacrificial spacer, forming a buffer insulator on the first doped region and the second doped region, wherein forming the grooving further comprises removing the buffer insulator below a removed portion of the sacrificial spacer.

BRIEF DESCRIPTION OF THE DRAWINGS

The embodiments of the invention are illustrated by way of example, and not by way of limitation, in the figures of the accompanying drawings:

FIG. 2A is a top plan view of a semiconductor device providing a contact structure having serial patterns in accordance with an embodiment of the invention;

FIGS. 4A through 10A are cross-sectional views taken along the line I-I' of FIG. 1A to explain an exemplary method of forming the semiconductor device of FIGS. 1A, 1B, and 1C;

FIGS. 4B through 10B are cross-sectional views taken along the line II-II' of FIG. 1A to explain an exemplary method of forming the semiconductor device of FIGS. 1A, 1B, and 1C;

FIGS. 11A through 13A are cross-sectional views taken along the line III-III' of FIG. 2A to explain an exemplary method of forming the semiconductor device of FIGS. 2A and 2B; and FIGS. 11B through 13B are cross-sectional views taken along the line IV-IV' of FIG. 2A to explain an exemplary method of forming the semiconductor device of FIGS. 2A and 2B.

DETAILED DESCRIPTION OF THE EMBODIMENTS

A device and method for providing contact structure are disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Although the embodiments of the invention are discussed with respect to semiconductor devices and processing methods, it is recognized by one of ordinary skill in the art that the embodiments of the inventions have applicability to any type of electronic components that exploit the electronic properties of materials, principally silicon, germanium, and gallium arsenide. Additionally, it is contemplated that semiconductor devices are manufactured both as single discrete and as integrated circuits (ICs), which consist of a number of processes for manufacturing devices on a semiconductor substrate.

Figure 1A:
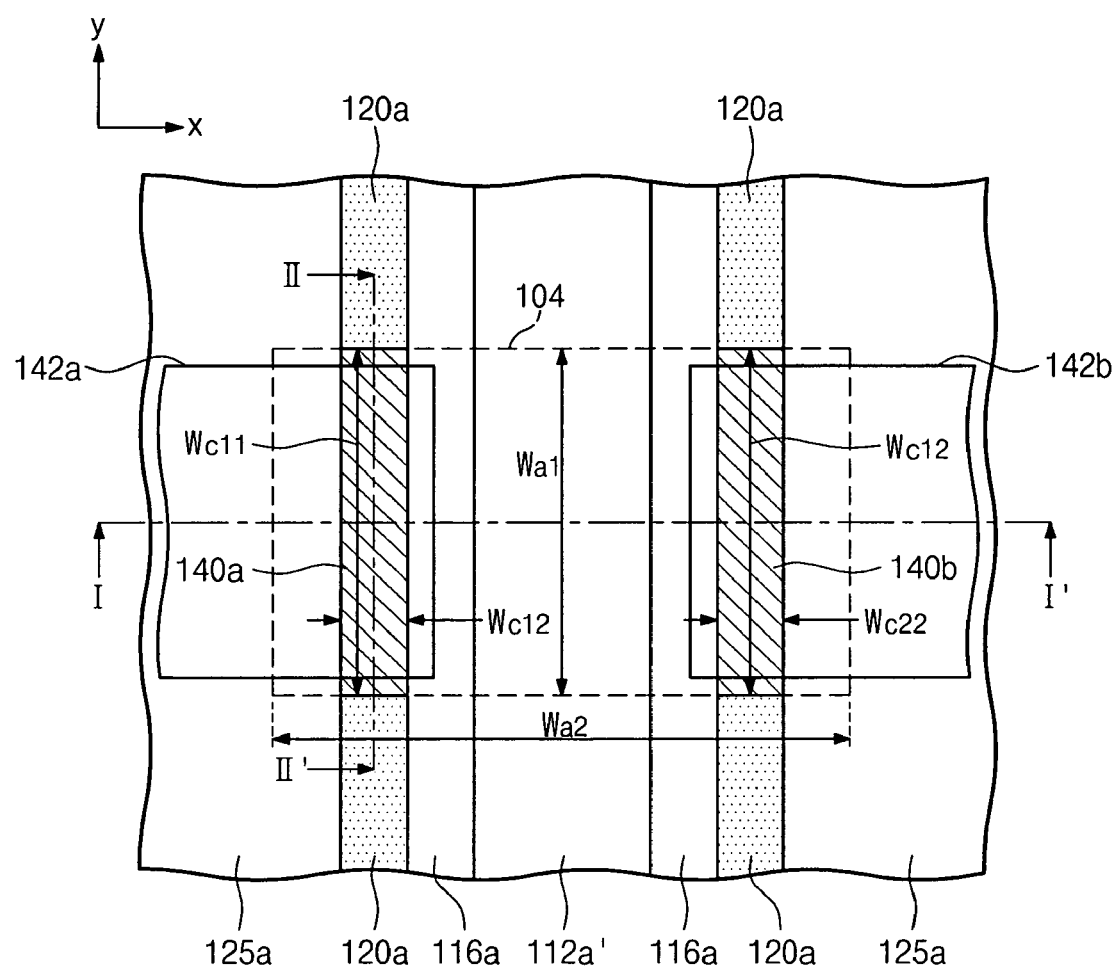
FIG. 1A is a top plan view of a semiconductor device providing a contact structure in accordance with an embodiment of the invention.
Figure 1B:
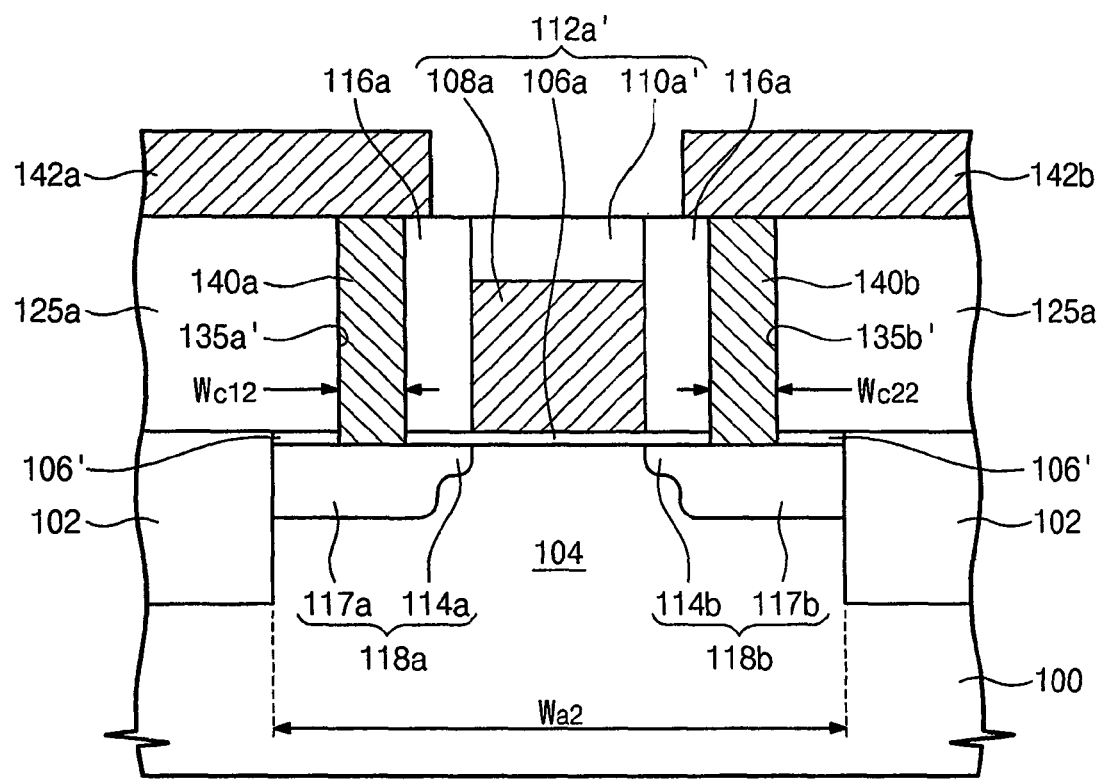
FIG. 1B is a cross-sectional view taken along the line I-I' of FIG. 1A.
Figure 1C:
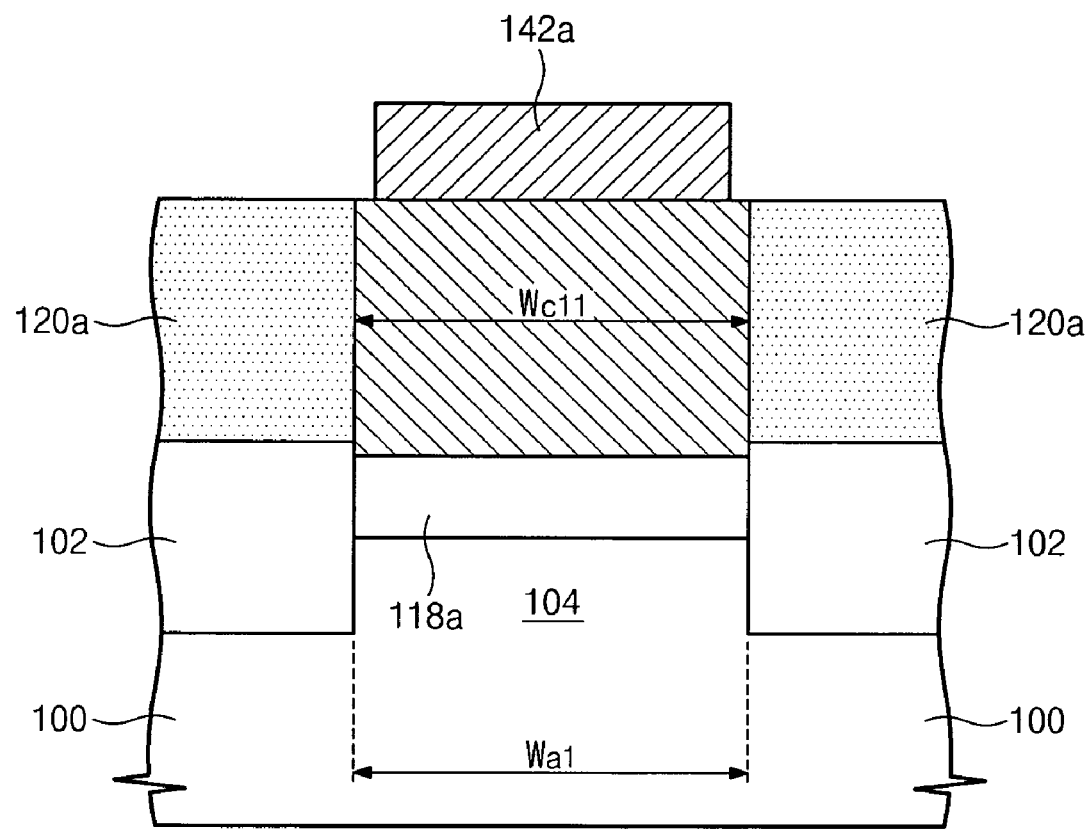
FIG. 1C is a cross-sectional view taken along the line II-II' of FIG. 1A.

FIG. 1A is a top plan view of a semiconductor device capable of providing a contact structure according to an embodiment of the invention. FIGS. 1B and 1C are cross-sectional views taken along the lines I-I' and II-II' of FIG. 1A, respectively.

As seen in FIGS. 1A, 1B, and 1C, a device isolation pattern 102 is disposed on a semiconductor substrate (hereinafter simply referred to as "substrate") 100 to define an active region 104. The active region 104 has a first width Wa1 in a first direction and a second width Wa2 in a second direction that is perpendicular to the first direction. The first direction corresponds to y-axis of FIG. 1A and the second direction corresponds to x-axis of FIG. 1A. The first and second directions are parallel with a top surface of the substrate 100. The device isolation pattern 102 may be a trench-type isolation pattern.

Under such circumstances, a gate pattern 112a' extends in the first direction (y-axis direction) to cross the active region 104 and to be disposed on the device isolation pattern 102. That is, the gate pattern 112a' extends in the first direction (y-axis direction) to be disposed on the active region 104 and the device isolation pattern 102. A longitudinal direction of the gate pattern 112a' corresponds to the first direction (y-axis direction), and a latitudinal direction associated with a width of the gate pattern 112a' corresponds to the second direction (x-axis direction). That is, the longitudinal direction and the latitudinal direction of the gate pattern 112a' are perpendicular to each other. A channel region defined at the active region 104 locates below the gate pattern 112a'. The channel region has a channel width in the longitudinal direction of the gate pattern 112a' and a channel length in the latitudinal direction of the gate pattern 112a'. The gate pattern 112a' includes a gate electrode 108a and a capping insulating pattern 110a' that are sequentially stacked on a substrate. The gate pattern 112a' further includes a gate insulator 106a interposed between the gate electrode 108a and the active region 104. The gate insulator 106a may include insulating materials such as oxide, nitride and/or oxynitride. By way of example, the gate electrode 108a may include at least one selected from the group consisting of doped semiconductor, metal (e.g., tungsten or molybdenum), conductive metal nitride (e.g., titanium nitride or tantalum nitride), or metal silicide (e.g., tungsten silicide or cobalt silicide).

According to an exemplary embodiment, first source/drain 118a and second source/drain 118b are disposed in the active region 104 adjacent to opposite sides of the gate pattern 112a', respectively. Namely, the first source/drain 118a and the second source/drain 118b are disposed in the active region 104 to be spaced apart from each other, and the gate pattern 112a' crosses over the active region 104 between the first source/drain 118a and the second source/drain 118b. The first source/drain 118a may be a first doped region doped with dopants, and the second source/drain 118b may be a second doped region doped with dopants being the same as the dopants in the first source/drain 118a. The first source/drain 118a may employ an LDD structure including a first lightly doped region 114a and a first heavily doped region 117a. Alternatively, the first source/drain 118a may include the first heavily doped region 117a. In this exemplary scenario, the second source/drain 118b may include a second lightly doped region 114b and a second heavily doped region 117b or a second heavily doped region 117b. A buffer insulator 106' can be disposed on the first source/drain 118a and the second source/drain 118b. The buffer insulator 106' may include the same insulating materials as those of the gate insulator 106a.

In an exemplary embodiment, gate spacers 116a are disposed on both sidewalls of the gate pattern 112a', respectively. An interlayer dielectric 125a is disposed on the substrate, while being spaced apart from the gate spacer 116a. In this example, the interlayer dielectric 125a is also spaced apart from the gate pattern 112a'. The gate spacer 116a is disposed between the gate pattern 112a' and the interlayer dielectric 125a. The gate spacer 116a adjacent to the first source/drain 118a covers a portion of the top surface of the first source/drain 118a adjacent to the gate pattern 112a'. The gate spacer 116a adjacent to the second source/drain 118b covers a portion of the top surface of the second source/drain 118b adjacent to the gate pattern 112a'. By way of example, the interlayer dielectric 125a may also cover portions of the first source/drain 118a and the second source/drain 118b.

In case the first source/drain 118a includes the first lightly and heavily doped regions 114a and 117a, the gate spacer 116a adjacent to the first source/drain 118a can cover a portion of the top surface of the first lightly doped region 114a and a portion of the top surface of the first heavily doped region 117a adjacent to the first lightly doped region 114a. On the other hand, in case the first source/drain 118a includes a single part of the first heavily doped region 117a, the gate spacer 116a adjacent to the first source/drain 118a may cover the edge of the top surface of the first heavily doped region 117a. Similarly, in case the second source/drain 118b includes the second lightly and heavily doped regions 114b and 117b, the gate spacer 116a adjacent to the second source/drain 118b can cover a portion of the top surface of the second lightly doped region 114b and a portion of the top surface of the second heavily doped region 117b adjacent to the second lightly doped region 114b. On the other hand, in case the second source/drain 118b includes a single part of the second heavily doped region 117b, the gate spacer 116a adjacent to the second source/drain 118b can cover the edge of the top surface of the second heavily doped region 117b.

As mentioned, the gate spacer 116a and the interlayer dielectric 125a are spaced apart from each other. The gate spacer 116a and the interlayer dielectric 125a, which are adjacent to the first source/drain 118a, define a first groove 135a' to expose a portion of the first source/drain 118a. That is, one sidewall of the first groove 135a' corresponds to the gate spacer 116a, the other sidewall of the first groove 135a' corresponds to the interlayer dielectric 125a, and a bottom surface of the first groove 135a' corresponds to a portion of the top surface of the first source/drain 118a. The first groove 135a' extends in the first direction (the y-axis direction, the longitudinal direction of the gate pattern 112a'). The top surface of the first source/drain 118a includes a first portion covered with the gate spacer 118a, a second portion exposed by the first groove 135a', and a third portion covered with the interlayer dielectric 125a. As, noted, when the buffer insulator 106' is disposed on the first source/drain 118a and the second source/drain 118b, the first groove 135a' exposes a portion of the first source/drain 118a through the buffer insulator 106' on the first source/drain 118a.

A sacrificial spacer 120a is disposed between the gate spacer 116a and the interlayer dielectric 125a and on the device isolation pattern 102. The sacrificial spacers 120a are disposed, at opposite sides of the gate pattern, 112a' on the device isolation pattern 102, respectively. The first groove 135a' is defined by the gate spacer 116a, the sacrificial spacer 120a, and the interlayer dielectric 125a adjacent to the first source/drain 118a. In an exemplary embodiment, the first groove 135a' includes a space surrounded by the gate spacer 116a, the sacrificial spacer 120a, and the interlayer dielectric 125a. The sacrificial spacer 120a includes an insulating material having an etch selectivity with respect to the gate spacer 116a and the interlayer dielectric 125a. Also the sacrificial spacer 120a may include an insulating material having an etch selectivity with respect to the capping insulating pattern 110a'. Moreover, when the buffer insulator 106' is disposed, the sacrificial spacer 120a may include an insulating material having an etch selectivity with respect to the buffer insulator 106'. By way of example, the sacrificial spacer 120a may include at least one of nitride or oxynitride, and each of the gate spacer 116a, the interlayer dielectric 125a, the capping insulating pattern 110a', and the buffer insulator 106' may include oxide. According to various exemplary embodiments, the gate spacer 116a, the interlayer dielectric 125a, the capping insulating pattern 110a', the buffer insulator 106' and the sacrificial spacer 120a may include a different material.

A first contact structure 140a fills the first groove 135a'. The first contact structure 140a provides a bar-shaped pattern extending in the first direction (y-axis direction) by the first groove 135a'. The first contact structure 140a is in contact with the first source/drain 118a. More specifically, the first contact structure 140a is in contact with the first heavily doped region 117a of the first source/drain 118a. The first contact structure 140a has a first width Wc11 in the first direction (y-axis direction) and a second width Wc12 in the second direction (x-axis direction). The first width Wc11 of the first contact structure 140a has at least a magnitude of the first width Wa1 of the active region 104 where the first source/drain 118a is formed. By way of example, the first width Wc11 of the first contact structure 140a can be equal to the first width Wa1 of the active region 104. It is contemplated that the first width Wc11 of the first contact structure 140a can be greater than the first width Wa1 of the active region 104. The second width Wc12 of the first contact structure 140a can be smaller than the first width Wc11 of the first contact structure 140a. The first contact structure 140a includes a conductive material having a lower resistivity than conductive material of the first source/drain 118a. The first contact structure 140a includes at least one selected from the group consisting of, for example, conductive metal nitride (e.g., titanium nitride, tantalum nitride or tungsten nitride) or metal (e.g., titanium, tantalum, copper, and aluminum). In an exemplary embodiment of the invention, the first contact structure 140a can include doped semiconductor. In this example, the doped semiconductor included in the first contact structure 140a may have a higher dopant concentration than that of the first source/drain 118a.

The gate spacer 116a and the interlayer dielectric 125a, which are adjacent to the second source/drain 118b, can define a second groove 135b' formed to expose a portion of the top surface of the second source/drain 118b. This arrangement supports that the second groove 135b' can further be defined by the sacrificial spacer 112a on the device isolation pattern 102. Namely, the second groove 135b' includes a space surrounded by a gate spacer 116a, an interlayer dielectric 125a, and a sacrificial spacer 120a which are adjacent to the second source/drain 118b. Similar to the first groove 135a', the second groove 135b' can be exposed to the second source/drain 118b through the buffer insulator 106' on the second source/drain 118b. A top surface of the second source/drain 118b includes a first portion covered with the gate spacer 116a, a second portion exposed by the second groove 135b', and a third portion covered with the interlayer dielectric 125a, respectively. The second groove 135b' extends in the first direction (y-axis direction).

The second contact structure 140b fills the second groove 135b'. In an alternative embodiment, similar to the first contact structure 140a, the second contact structure 140b provides a bar shaped pattern extending in the first direction (y-axis direction) by the second groove 135b'. The second contact structure 140b is in contact with the second source/drain 118b. More specifically, the second contact structure 140b is in contact with the second heavily doped region 117b of the second source/drain 118b. The second contact structure 140b has a first width Wc21 in the first direction (y-axis direction) and a second width Wc22 in the second direction (x-axis direction). The first width Wc21 of the second contact structure 140b can be equal to the first width Wa1 of the active region 104 where the second source/drain 118b is formed. Alternatively, the first width Wc21 of the second contact structure 140b can be higher than the first width Wa1 of the active region 104. The first width Wc21 of the second contact structure 140b can be equal to the first width Wc11 of the first contact structure 140a. The second width Wc22 of the second contact structure 140b can be equal to the second width Wc12 of the first contact structure 140a. The second contact structure 1470b can be made of the same material as the first contact structure 140a.

The top surfaces of the contact structures 140a and 140b can be coplanar with the top surface of the interlayer dielectric 125a. The gate spacer 116a can have a flat top surface that is coplanar with the top surfaces of the contact structures 140a and 140b. The sacrificial spacer 120a can also have a flat top surface that is coplanar with the top surfaces of the contact structures 140a and 140b. In an exemplary embodiment of the invention, the top surfaces of the contact structures 140a and 140b, the interlayer dielectric 125a, the gate spacer 116a, and the sacrificial spacer 120a can be coplanar with one another.

The gate electrode 108a, the first source/drain 118a, and the second source/drain 118b constitute a MOS transistor with a peripheral circuit or a logic circuit of a semiconductor memory device.

A first top conductor 142a is disposed on the interlayer dielectric 125a to be connected to the first contact structure 140a, and a second top conductor 142b is disposed on the interlayer dielectric 125a to be connected to the second contact structure 140b. The first and second top conductors 142a and 142b can be laterally spaced apart from each other. Due to an alignment margin between the first top conductor 142a and the first contact structure 140a, the first top conductor 142a can extend to be disposed on the gate spacer 116a adjacent to the first contact structure 140a. Similarly, due to the alignment margin therebetween, the second top conductor 142b may extend to be disposed on the gate spacer 116a adjacent to the second contact structure 140b.

Each of the first and second top conductors 142a and 142b provides a proper shape capable of accomplishing interconnection. Alternatively, each of the first and second top conductors 142a and 142b provides pillar shaped pattern disposed in an overlying interlayer dielectric (not shown) on the interlayer dielectric 125a. In case each of the first and second top conductors 142a and 142b, pillar shaped pattern, interconnections connected to the first and second conductors 142a and 142b can be disposed on the overlying interlayer dielectric.

According to another exemplary invention, when a voltage is equivalently applied to the first source/drain 118a and the second source/drain 118b, the first and second top conductors 142a and 142b can laterally be extended being formed in contact with each other.

According to various embodiments of the invention, the first contact structure 140a provides bar shaped pattern extending in the first direction (y-axis direction), i.e., longitudinal direction of the gate pattern 112a'. As such, it is possible to reduce distance variation resulted from a position between the channel region and the first contact structure 140a. Specifically, the shortest distance between a channel region central portion and the first contact structure 140a can be of the first shortest distance, and the shortest distance between a channel region edge portion adjacent to the device isolation pattern 102 and the first contact structure 140a can be of the second shorted distance. The first contact structure 140a provides bar shaped pattern extending in the longitudinal direction of the gate pattern 112a' to reduce the difference between the first and second shortest distances.

If a cylindrical contact plug comes in contact with the top surface of the first source/drain 118a, the shortest distance between the channel region central portion and the contact plug can be shorter than the shortest distance between the channel region edge portion and the contact plug. Thus, a resistance between the channel region edge portion and the contact plug is higher than that between the channel region central portion and the contact plug. From this perspective, low resistance contact structure can be achieved since the amount turn-on current flowing through the channel region edge portion decreases, this permits the total amount of turn-on current of a MOS transistor be decreased.

On the other hand, according to various embodiments of the invention, the first contact structure 140a provides a bar shaped pattern extending in the longitudinal direction of the gate pattern 112a' to decrease the second shortest distance (i.e., the shortest distance between the channel region edge portion and the first contact structure 140a). Consequently, the amount of current flowing through the channel region edge portion increases, which enables to increase the amount of turn-on current of a MOS transistor including the first source/drain 118a, the second source/drain 118b, and the gate pattern 112a'. As a result, an optimized semiconductor device in terms of high density device can be achieved. Moreover, since increasing the amount of turn-on current enhances an operation speed of the MOS transistor, a high-speed semiconductor device can be achieved.

According to an exemplary embodiment of the invention, the first width Wc11 of the first contact structure 140a can be equal to or greater than the first width Wa1 of the active region 102 where the first source/drain 118a is formed. Thus, the first contact structure 140a can be in contact with the substantially entire width in the first direction (y-axis direction) of the first source/drain 118a. As a result, the first and second shortest distances can be substantially equal to each other, and the amount of turn-on current can be uniformly output throughout the channel width of the channel region.

According to an embodiment, the first contact structure 140a fills the first groove 135a' defined by the gate spacer 116a, the interlayer dielectric 125a, and the sacrificial spacer 120a. That is, a distance between the first contact structure 140a and the gate pattern 112a' (i.e., the channel region) can be determined by the gate spacer 116a. For this reason, the distance between the first contact structure 140a and the gate pattern 112a' (i.e., the channel region) permits to improve reproducibility and a highly reliable semiconductor device can be achieved.

In an exemplary embodiment of the invention, the second source/drain 118b can be in contact with the second contact structure 140b having the same shaped pattern as that of the first contact structure 140a. Thus, the output or input amount of turn-on current of the MOS transistor can be increased through the second contact structure 140b.

By way of example, the formation of the second contact structure 140b may be omitted on the second source/drain 118b. In such a scenario, the MOS transistor can be connected to in serial with another transistor.

Figure 2B:
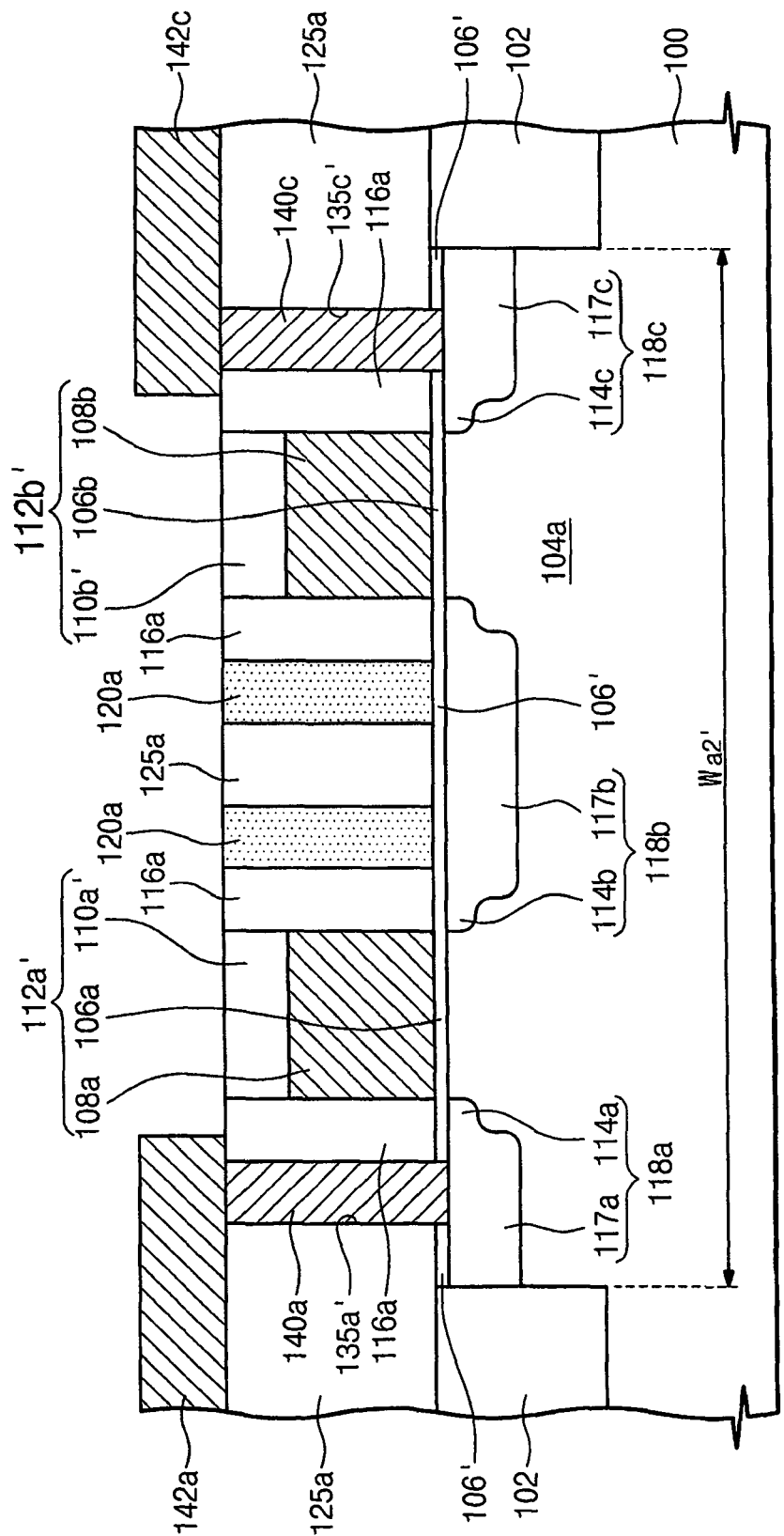
FIG. 2B is a cross-sectional view taken along the line III-III' of FIG. 2A.

FIG. 2A is a top plan view of a semiconductor device, and FIG. 2B is a cross-sectional view taken along the line III-III' of FIG. 2A in accordance with an embodiment of the invention.

As seen in FIGS. 2A and 2B, a device isolation pattern 102 is disposed on a substrate 100 to define an active region 104a. The active region 104a has a first width Wa1 in a first direction (y-axis direction) and a second width Wa2' in a second direction (x-axis direction) that is perpendicular to the first direction (y-axis direction). A first gate pattern 112a' and a second gate pattern 112b' cross the active region 104a in parallel to each other. The first and second gate patterns 112a' and 112b' extend in the first direction (y-axis direction) to be arranged on the active region 104a and on the device isolation pattern 102. The first direction (y-axis direction) corresponds to a longitudinal direction of the first and second gate patterns 112a' and 112b', and the second direction (x-axis direction) corresponds to a latitudinal direction thereof.

The first gate pattern 112a' may include a first gate insulator 106a, a first gate electrode 108a, and a first capping insulating pattern 110a' which are sequentially stacked on a substrate. The second gate pattern 112b' can include a second gate insulator 106b, a second gate electrode 108b, and a second capping insulating pattern 110b' which are sequentially stacked on a substrate. The second gate pattern 112b' can include a second gate insulator 106b, a second gate electrode 108b, and a second capping insulating pattern 110b' each of which can be made of the same materials as that of the first gate insulator 106a, the first gate electrode 108a, and the first capping insulating pattern 110a', respectively.

A first source/drain 118a is formed in an active region 104a adjacent to one side of the first gate pattern 112a', a second source/drain 118b is formed in the active region 104a between the first and second gate patterns 112a' and 112b', and a third source/drain 118c is formed in an active region 104a adjacent to one side of the second gate pattern 112b'. In other words, the first source/drain 118a, the second source/drain 118b, and the third source/drain 118c are sequentially arranged in the active region 104a in the second direction (x-axis direction). The first source/drain 118a, the second source/drain 118b, and the third source/drain 118c are spaced apart from one another. In this exemplary embodiment, the first gate pattern 112a' is disposed on the active region 104a between the first source/drain 118a and the second source drain 118b, and the second gate pattern 112b' is disposed on the active region 104a between the second source/drain 118b and the third source/drain 118c.

Similar to the first source/drain 118a and the second source/drain 118b of FIGS. 1A, 1B, and 1C, the third source/drain 118c may employ an LDD structure including a third lightly doped region 114c and a third heavily doped region 117c. Alternatively, the third source/drain 118c may include only the third heavily doped region 117c. By way of example, the first source/drain 118a, the second source/drain 118b, and the third source/drain 118c have the same characteristic of dopant concentration. A buffer insulator 106' can be disposed on the first source/drain 118a, the second source/drain 118b, and the third source/drain 118c. The buffer insulator 106' may include the same material as that of the first and second gate insulators 106a and 106b.

A gate spacer 116a is disposed on both sidewalls of the first and second gate patterns 112a' and 112b'. An interlayer dielectric 125a, which is laterally spaced apart from the gate spacer 116a, is disposed on the substrate 100. The interlayer dielectric 125a may cover a portion of the active region 104a and the device isolation pattern 102. A sacrificial spacer 120a is disposed between the interlayer dielectric 125a and the gate spacer 116a disposed on the device isolation pattern 102. The sacrificial spacer 120a, the interlayer 125a, and the gate spacer 116a adjacent to the first source/drain 118a define a first groove 135a'. The first contact structure 140a fills the first groove 135a' and is in contact with the first source/drain 118a. In case the buffer insulator 106' is disposed on the first source 118a, the first groove 135a' penetrates the first buffer insulator 106'. The first contact structure 140a provides bar shaped pattern extending in a longitudinal direction of the first gate pattern 112a'. The first contact structure 140a has a first width Wc11 in the first direction (y-axis direction) and a second width Wc12 in the second direction (x-axis direction). The first width Wc11 of the first contact structure 140a can be equal to or greater than the first width W1a of the active region 104a.

Sacrificial spacers 120a, adjacent to the second source/drain 118b are disposed on one sidewall of the first gate pattern 112a' and one sidewall of the second gate pattern 112b' extend in the first direction (y-axis direction) to cross over the second source/drain 118b. The extending portions of the sacrificial spacers 120a are disposed on the second source/drain 118b. In addition, the extending portions of the sacrificial spacers 120a are disposed between the interlayer dielectric 125a and the gate spacer 116a and on a sidewall of the first gate pattern 112a', and the extending portions of the sacrificial spacers 120a are disposed between the interlayer dielectric 125a and the gate spacer 116a and on a sidewall of the second gate pattern 112b', respectively.

The gate spacer 116a, the interlayer dielectric 125a, and the sacrificial spacer 120a, which are adjacent to the third source/drain 118c, define a second groove 135c' to expose the third source/drain 118c. In case the buffer insulator 106' is disposed on the third source/drain 118c, the second groove 135c' can penetrate the buffer insulator 106'. The second contact structure 140c provides bar shaped pattern extending in the first direction (y-axis direction, i.e., longitudinal direction of the second gate pattern 112b'). The second contact structure 140c has a first width Wc31 in the first direction (y-axis direction) and a second width Wc32 in the second direction (x-axis direction). The first width Wc31 of the second contact structure 140c is equal to or greater than the first width Wa1 of the active region 104a where the third source/drain 118c is formed. The second width Wc32 of the second contact structure 140c can be equal to the second width Wc12 of the first contact structure 140a.

Top surfaces of the first and second contact structure 140a and 140c, the interlayer dielectric 125a, the gate spacer 116a, and the sacrificial spacer 120a can be coplanar with one another. A first top conductor 142a is disposed on the interlayer dielectric 125a to be connected to the first contact structure 140a, and a second top conductor 142c is disposed on the interlayer dielectric 125a to be connected to the second contact structure 140c. The second top conductor 142c can be made of the same material as that of the first top conductor 142a. Similar to the shape of the first top conductor of FIGS. 1A, 1B, and 1C, the second top conductor 142c provides a proper shaped pattern for interconnection or pillar-shaped interconnection pattern. In an exemplary embodiment of the present invention, when a voltage is equivalently applied to the first source/drain 118a and the third source/drain 118c, the first and second top conductors 142a and 142c can extend in the second direction (x-axis direction) to be connected to each other.

The first source/drain 118a, the second source drain 118b, and the first gate pattern 112a' constitute a first MOS transistor, and the second source/drain 118b, the third source/drain 118c, and the second gate pattern 112b' constitute a second MOS transistor. The first and second MOS transistors can be connected in serial with each other. Another operating voltage may not be applied to the second source/drain 118b that the first and second MOS transistors share. In this case, the sacrificial spacer 120a can extend in the longitudinal direction of the gate patterns 112a' and 112b' to cross over the second source/drain 118b. That is, the gate spacer 116a, the sacrificial spacer 120a, and the interlayer dielectric 125a can be disposed on the second source/drain 118a. Alternatively, the first and second MOS transistors constitute a logic circuit of a semiconductor logic device. In this exemplary embodiment, a pair of MOS transistors are connected in serial with each other. However, the embodiments of the invention are not limited any specific thereto. According to various embodiments o the invention based on the configuration of a peripheral circuit and the configuration of a logic circuit, it is contemplated that at least three MOS transistors can be connected in series and/or parallel. At least one source/drain included in at least one of the at least three MOS transistors may be connected to another contact structure according to an embodiment of the invention.

Sacrificial spacers, each of which can be disposed on a device isolation pattern 102 and on both sidewalls of the gate pattern 112a' can extend along a sidewall of its ends in the first direction (y-axis direction) to be connected to each other. In this case, the gate pattern 112a' can provide a finger-shaped pattern, which will now be described below with reference to FIG. 3.

Figure 3:
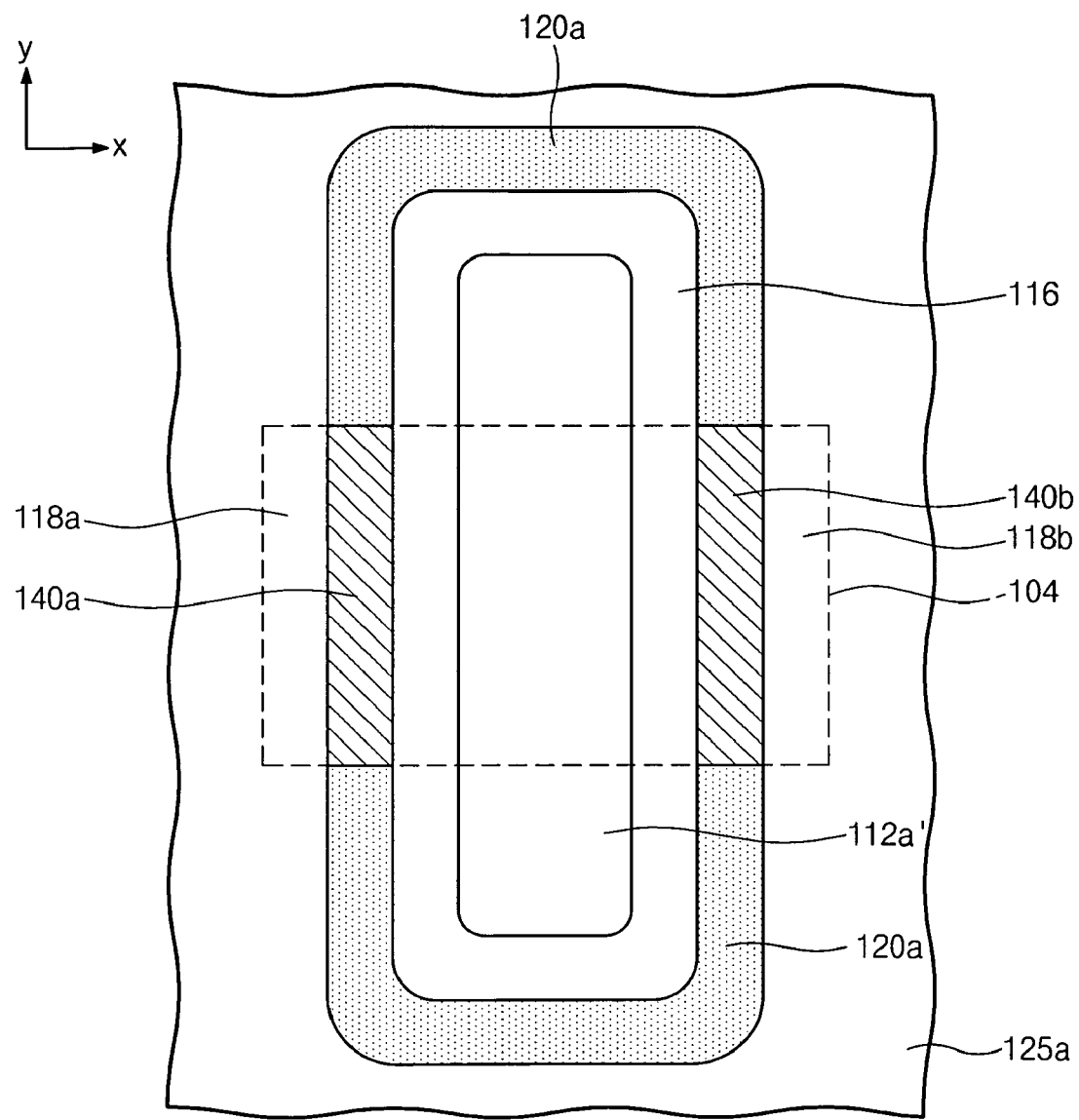
FIG. 3 is a top plan view of a semiconductor device showing a gate pattern formed associated with a gate spacer, a sacrificial spacer and an interlayer dielectric in accordance with an embodiment of the invention.

FIG. 3 is a top plan view of a semiconductor device according to an embodiment of the invention.

As seen in FIG. 3, a gate pattern 112a' extends in a first direction (y-axis direction) to cross over an active region 104 and to be disposed on a device isolation pattern. A first source/drain 118a and a second source/drain 118b are formed in the active region 104 adjacent to opposite sides of a gate pattern 112a', respectively. A gate spacer 116a is disposed on a sidewall of the gate pattern 112a'. More specifically, the gate spacer 116a disposed on both sidewalls of the central portion of the gate pattern 112a' is disposed on the active region 104 and sidewalls of both ends of the gate pattern 112a' and disposed on a device isolation pattern. The end of the gate pattern 112a' may include a first sidewall, a second sidewall, and a third sidewall. The first sidewall of the end is adjacent to the first source/drain 118a and extends in the first direction (y-axis direction, i.e., longitudinal direction of the gate pattern 112a'). The second sidewall of the end is adjacent to the second source/drain 118a and extends in the first direction (y-axis direction). The third sidewall of the end extends in the second direction (x-axis direction) and is connected to the first and second sidewalls. That is, the each of the end disposed on the device isolation pattern of the gate pattern 112a' includes a sidewall having successive structure cover from the first sidewall to the third sidewall via the second sidewall. Thus, the gate spacer 116a can be successively disposed along the entire sidewall of the gate pattern 112a'. From the top perspective, the gate spacer 116a can provide a closed-loop surface. A second portion included in the sidewall of the end of the gate pattern 112a' can provide a curved surface.

An interlayer dielectric 125a, which is laterally spaced apart from the gate spacer 116a, is disposed on a substrate. A sacrificial spacer 120a is disposed between the interlayer dielectric 125a and the gate spacer 116a on a device isolation pattern. As mentioned above, since the end of the gate pattern 112a' on the device isolation pattern includes the successive sidewall, the end of the gate spacer 116a on the device isolation pattern includes a successive sidewall. Thus, the sacrificial spacer 116a disposed between the interlayer dielectric 125a and the gate spacer 116a also has a successive shape. That is, the sacrificial spacer 120a extends along the first, second, and third sidewalls of the end of the gate pattern 112a, having a successive shape.

Figure 4:
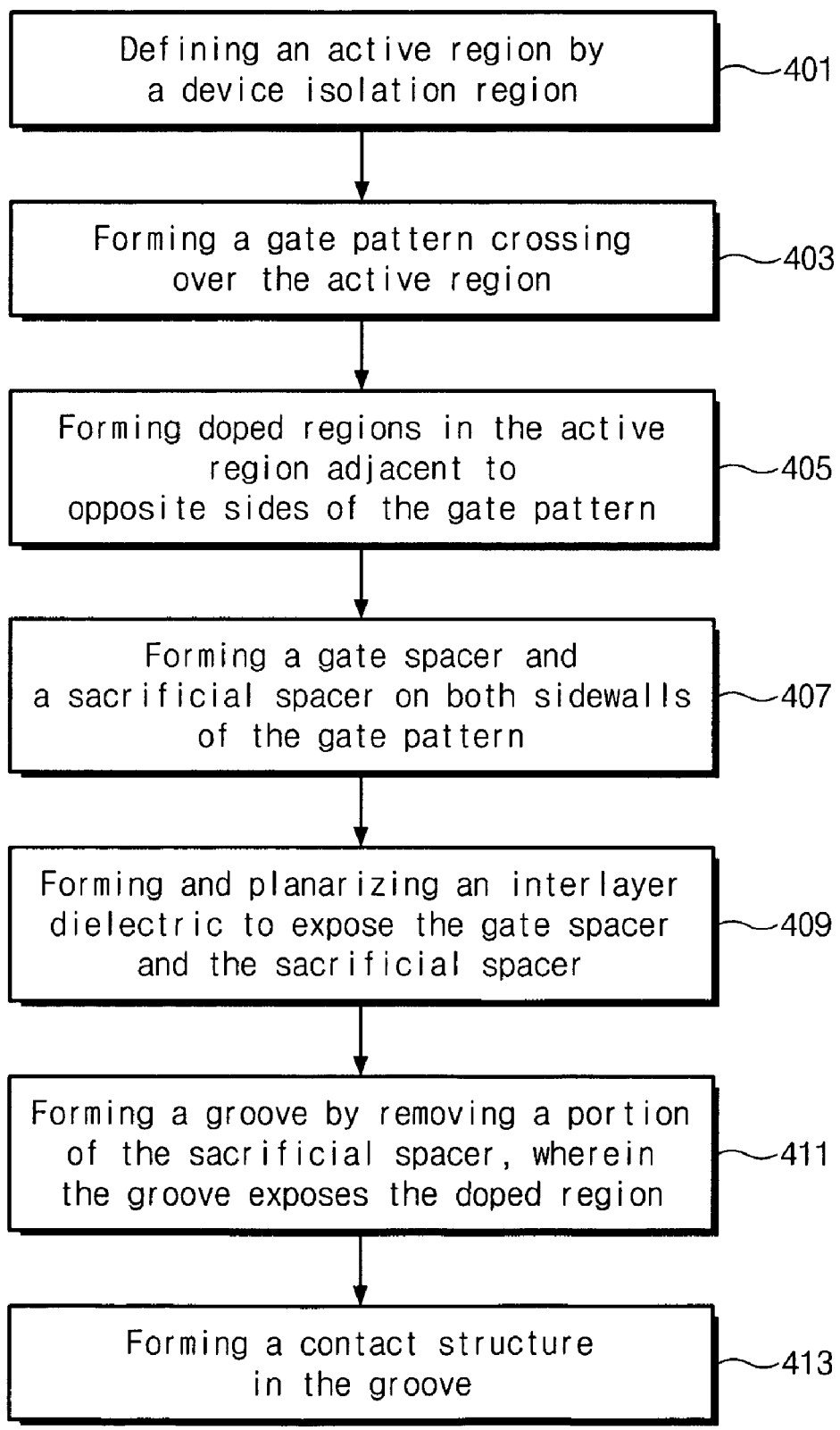
FIG. 4 is a flowchart of a process for providing a contact structure in support of reproducible device optimized for high-density processing in accordance with an embodiment of the invention.

FIG. 4 is a flowchart of a process for providing a contact structure in support of reproducible device optimized for high-density processing. In this process, per step 401, an active region having channel region may be defined by a device isolation region on a substrate. In step 403, a gate pattern is formed in features of crossing over the active region. A portion of gate pattern may be disposed on the device isolation region. In step 405, a first doped region and a second doped region are formed in the active region adjacent to opposite sides of the gate pattern, respectively. A gate spacer and a sacrificial spacer are formed on both side walls of the gate pattern per step 407. The sacrificial spacer may be formed after the gate spacer is formed. In step 409, an interlayer dielectric is formed and the interlayer dielectric is planarized to expose the gate spacer and the sacrificial spacer. In step 411, a groove is formed by removing a portion of the sacrificial spacer, wherein the groove exposes the doped region. In step 413, a contact structure is formed in the groove. The contact structure may be contact with the doped region. The contact structure can be self-aligned by the groove. The process for providing a contact structure enables to process reliable and reproducible device under a situation high-density and high-yield are required.

FIGS. 4A through 10A are cross-sectional views taken along the line I-I' of FIG. 1A to explain a an exemplary method of forming the semiconductor device of FIGS. 1A, 1B, and 1C, and FIGS. 4B through 10B are cross-sectional views taken along the line II-II' of FIG. 1A to explain an exemplary method of forming the semiconductor device of FIGS. 1A, 1B, and 1C.

Figure 4A:
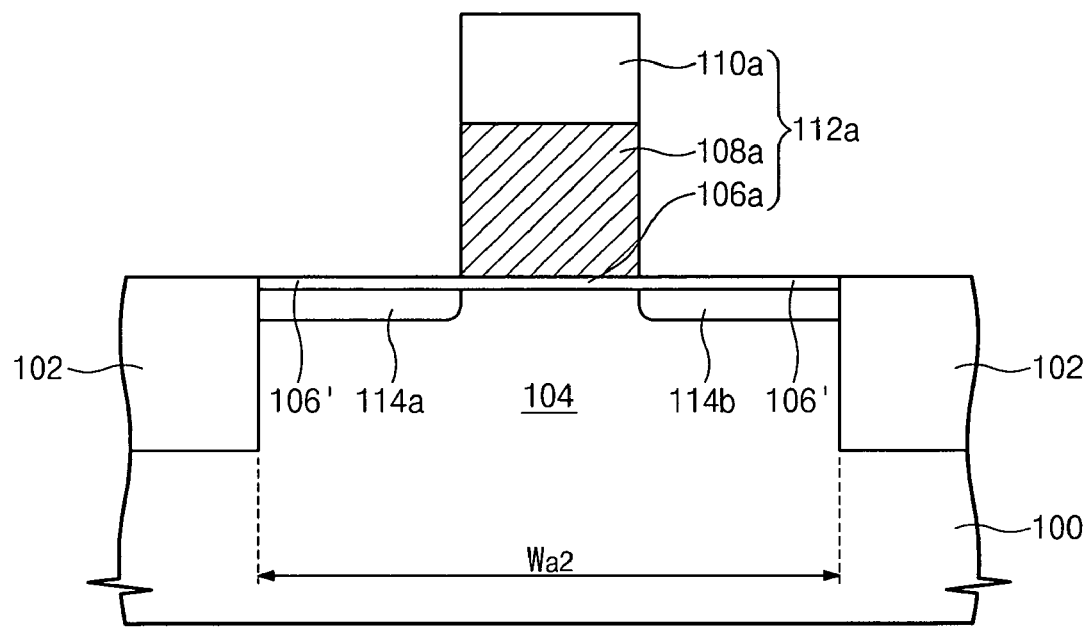
Figure 4B:
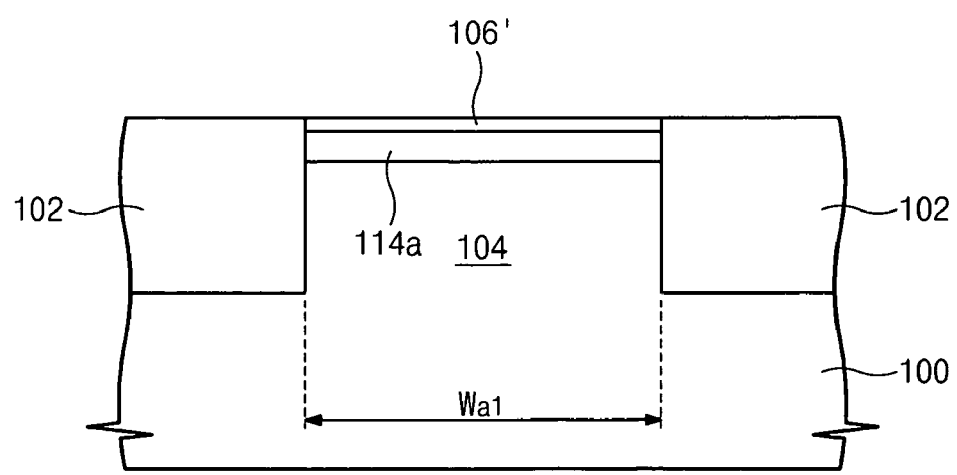

As seen in FIGS. 4A and 4B, a device isolation pattern 102 of a substrate 100 is configured to define an active region 104. A gate pattern 112a is formed to cross over the active region 104, while being disposed on the device isolation pattern 102. The active region 104 has a first width Wa1 in a longitudinal direction of the gate pattern 112a (y-axis direction of FIG. 1A) and a second width Wa2 in a latitudinal direction thereof (x-axis direction of FIG. 1A), wherein the longitudinal and latitudinal directions of the gate pattern 112a are perpendicular to each other. The gate pattern 112a includes a gate insulator 106a, a gate electrode 108a, and a capping insulating pattern 110a that are sequentially stacked on a substrate. A buffer insulator 106' can be formed on the active region 104 adjacent to opposite sides of the gate pattern 112a. The buffer insulator 106' can be formed of the same material as the gate insulator 106a. For example, the gate pattern 112a can be formed by sequentially forming a gate insulator, a gate conductive layer, and a capping insulator on the entire surface of the substrate 100 and successively patterning the capping insulator, the gate conductive layer, and the gate insulator. As shown, the gate insulator remains at opposite sides of the gate pattern 112a following the patterning process. The buffer insulator 106' includes the gate insulator remaining on the active region adjacent to opposite sides of the gate pattern 112a. After performing the patterning process for the gate pattern 112a, a gate oxidation process can be performed to form an oxide layer on both sidewalls of the gate pattern 112a or to form an oxide layer on both sidewalls of the gate pattern 112a and the active region 104 adjacent to opposite sides of the gate pattern 112a. In case the oxide layer is formed on both sidewalls of the gate pattern 112a and the active region 104 adjacent to opposite sides of the gate pattern 112a, the buffer insulator 106' may include the oxide layer formed by means of the gate oxidation process. Alternatively, after performing the patterning process, a gate insulator remaining on the active region 104 adjacent to opposite sides of the gate pattern 112a can be removed by means of a wet cleaning process and the gate oxidation process can be performed. In this case, the buffer insulator includes only an oxide layer formed by means of the gate oxidation process. Further, in an alternative way, the gate oxidation process may be omitted. Under the above arrangement, the buffer insulator 106' includes at least one of a gate insulator remaining on the active region 104 adjacent to opposite sides of the gate pattern 112a or an oxide layer formed by means of the gate oxidation process.

A first ion implanting process can be performed using the gate pattern 112a as a mask to form a first lightly doped region 114a and a second lightly doped region 114b at the active region adjacent to opposite sides of the gate pattern 112a. The buffer insulator 106' can be used as an ion implanting buffer during the first ion implanting process.

Figure 5A:
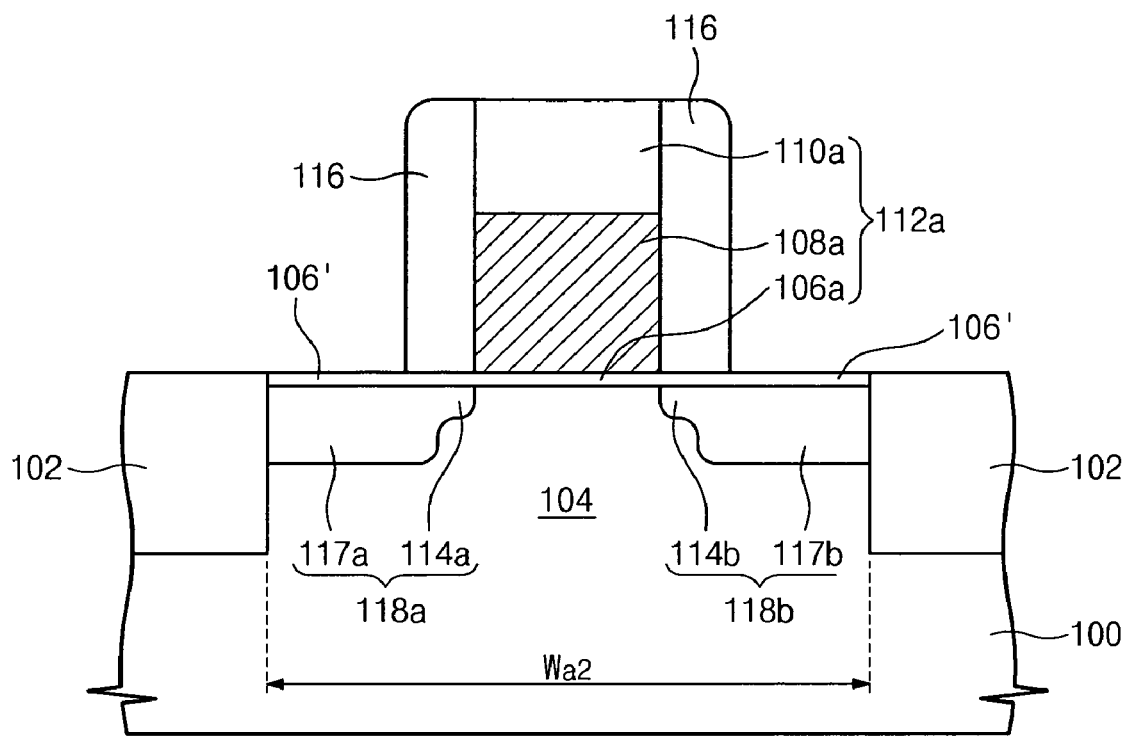
Figure 5B:
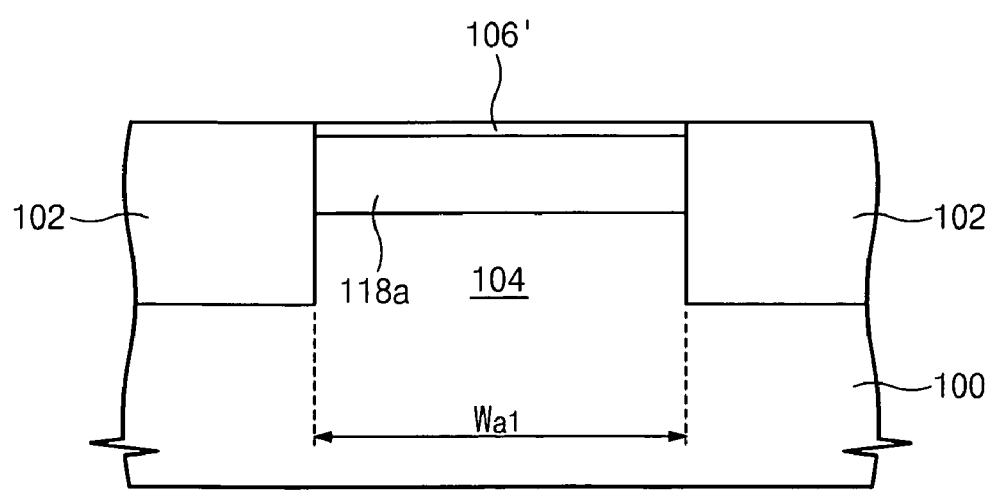

As seen in FIGS. 5A and 5B, a first spacer layer is conformally formed on the entire surface of the substrate 100. The first spacer layer is can be etched back to form a gate spacer 116 on both sidewalls of the gate pattern 112a.

In this example, using the gate pattern 112a and the gate spacer 116 as masks, a second ion implanting process can be performed for the active region 104 to form a first heavily doped region 117a and a second heavily doped region 117b. Typically, dosage of the second ion implanting process is higher than that of the first ion implanting process. The second ion implanting process may employ an oblique implanting process. Thus, the first and second heavily doped regions 117a and 117b can be formed below the gate spacer 116a. By way of example, the first and second heavily doped regions 114a and 117a can constitute a first source/drain 118a, and the second heavily doped regions 114b and 117b can constitute a second source/drain 118a. The first ion implanting process may be omitted.

Figure 6A:
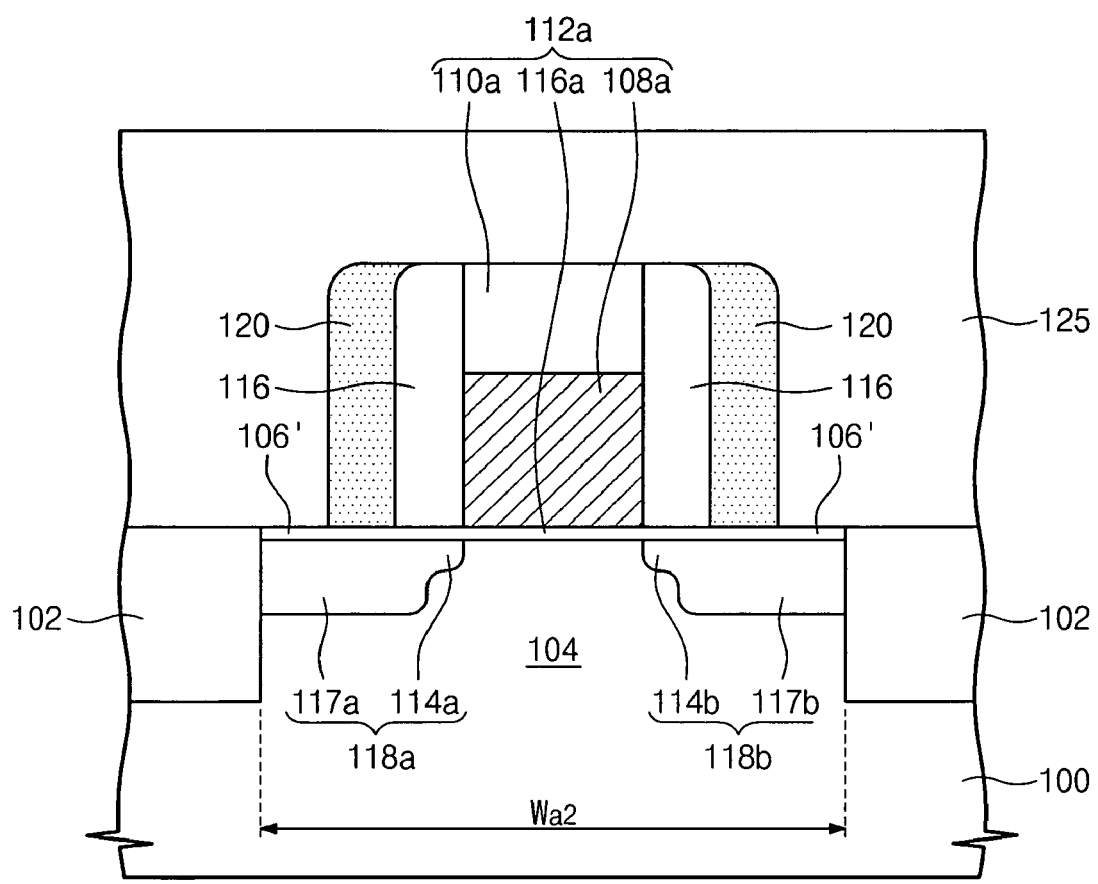
Figure 6B:
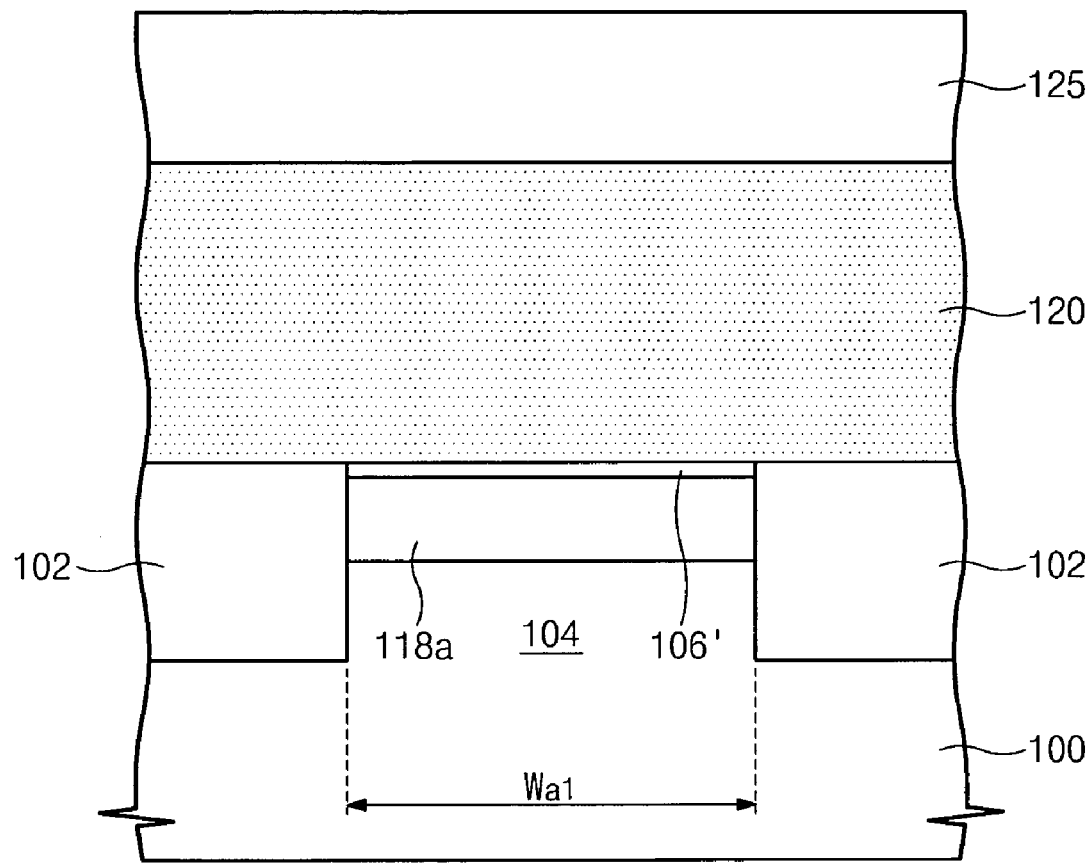

As seen in FIGS. 6A and 6B, a second spacer layer is conformally formed on the entire surface of the substrate 100 where the first source/drain 118a and the second source/drain 118b are formed. In this example, the second spacer layer can be anisotropically etched to form a sacrificial spacer 120 on both sidewalls of the gate pattern 112a. An interlayer dielectric 125 can be formed on the entire surface of the substrate 100 including the sacrificial spacer 120. The sacrificial spacer 120 may include an insulating material having an etch selectivity with respect to the gate spacer 116 and the interlayer dielectric 125. In addition, the sacrificial spacer 120 may have an etch selectivity with respect to the capping insulating pattern 110a. For example, the sacrificial spacer 120 may include at least one of oxide or oxynitride, and the gate spacer 116, the interlayer dielectric 125, and the capping insulating pattern 110a may include oxide. However, the embodiments of the invention are not limited any specific thereto.

Figure 7A:
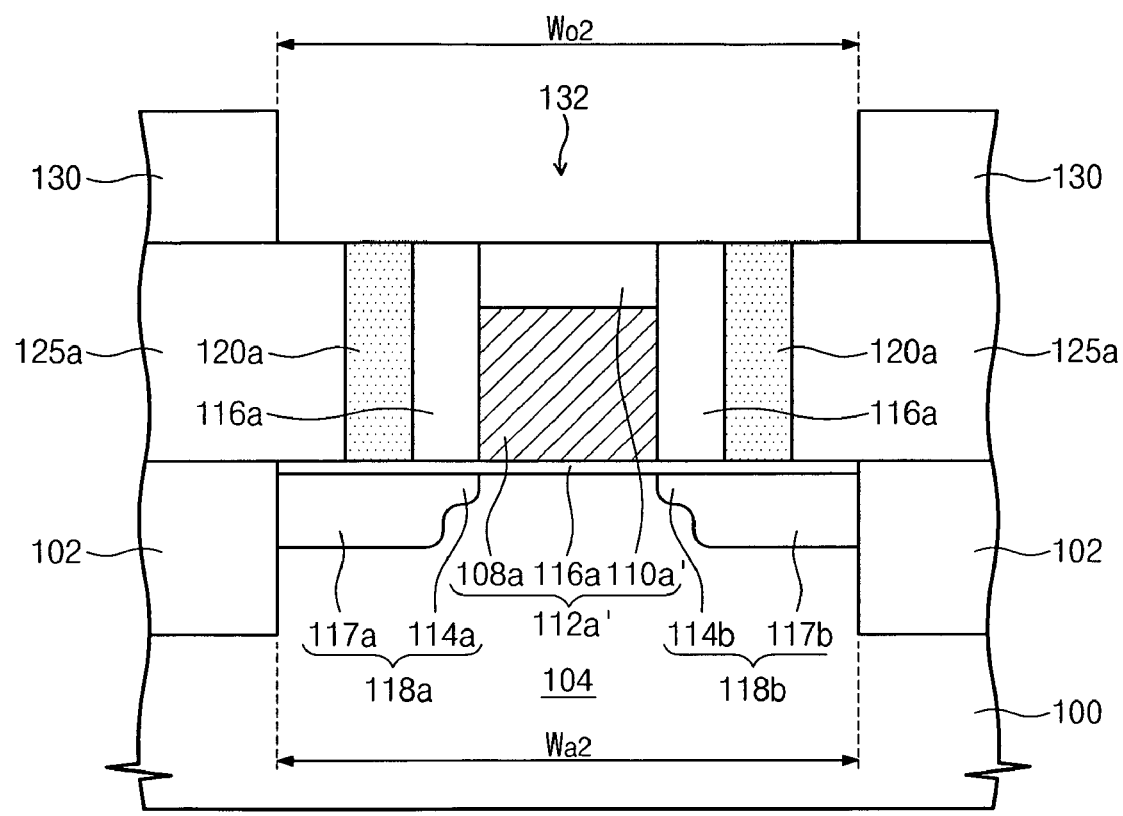
Figure 7B:
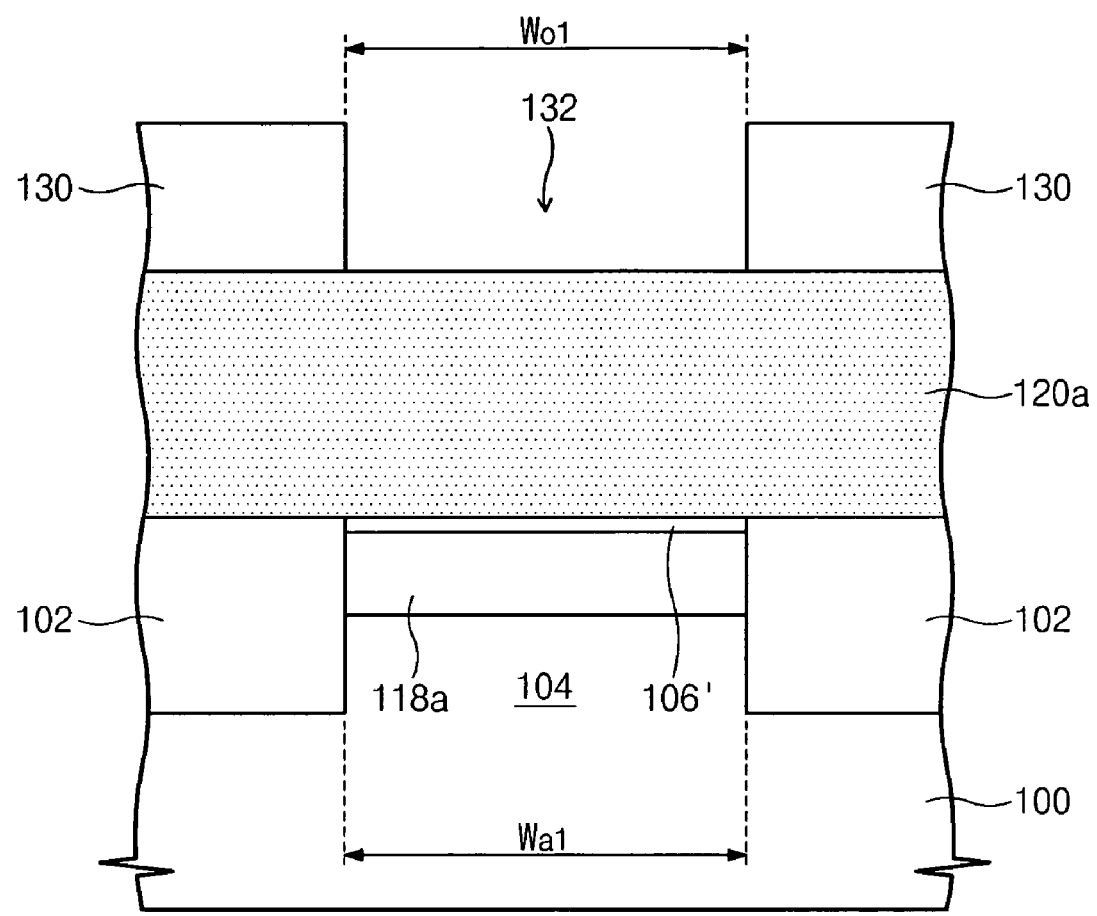

As seen in FIGS. 7A and 7B, the interlayer dielectric 125 is planarized down to a top surface of the sacrificial spacer 120. During the planarization of the interlayer dielectric 125, an upper portion of the capping insulating pattern 110a, an upper portion of the gate spacer 116, and an upper portion of the spacer 120 can be further planarized. In this example, the planarized sacrificial spacer 120a, the planarized gate spacer 116a', the planarized capping insulating pattern 110a', and the planarized interlayer dielectric 125a may have planarized top surfaces, respectively. A reference numeral 112a' represents a gate pattern 112' including the planarized insulating pattern 110a'. The planarization process may include a chemical mechanical polishing (CMP) process. Alternatively, the planarization process may include an etch-back process for the interlayer dielectric 125 and a CMP process which are sequentially performed.

After performing the planarization process, a mask pattern 130 with an opening 132 is formed on the substrate 100. The opening 132 is formed to expose a first portion of the sacrificial spacer 120a disposed on the first source/drain 118a. By way of example, the opening 132 can be formed to expose a second portion of the sacrificial spacer 120a disposed on the second source/drain 118b. In addition, the opening 132 can be formed to further expose the gate spacer 116a and the interlayer dielectric 125a that are adjacent to the sacrificial spacer 120a. The mask pattern 130 may cover the third portion of the sacrificial spacer 120a disposed on the device isolation pattern 102.

The opening 132 has a first width Wo1 in the longitudinal direction of the gate pattern 112a' and a second width Wo2 in the latitudinal direction thereof. The first width Wo1 of the opening 132 may be equal to the first width Wa1 of the active region 104. Accordingly, widths of the exposed first and second portions of the sacrificial spacer 120a in the longitudinal direction may be equal to the first width Wa1 of the active region 104. The opening 132 may be aligned on the active region 104. In this example, the opening 132 may be aligned on the active region 104 within an align margin of a photolithography process between the opening 132 and the active region 104. In an exemplary embodiment, within the alignment margin between the opening 132 and the active region 104, the opening 132 may shift in the longitudinal direction and/or in the latitudinal direction of the gate pattern 112a' from the active region 104.

The second width Wo2 of the opening 132 may be equal to the second width Wa2 of the active region 104. In this example, an area exposed by the opening 132 may be equal to that of the active region 104, and the capping insulating pattern 110a' between the first and second portions of the sacrificial spacer 120a may be further exposed by the opening 132. In case the area of the opening 132 is equal to that of the active region 104 in which the opening 132 can be defined using the reverse version of a reticle pattern for defining the active region 104. Alternatively, the opening 132 may be defined using a reticle pattern containing negative photoresist for defining the active region 104. The negative photoresist is a photoresist whose exposed portion remains and unexposed portion can be removed.

Figure 8A:
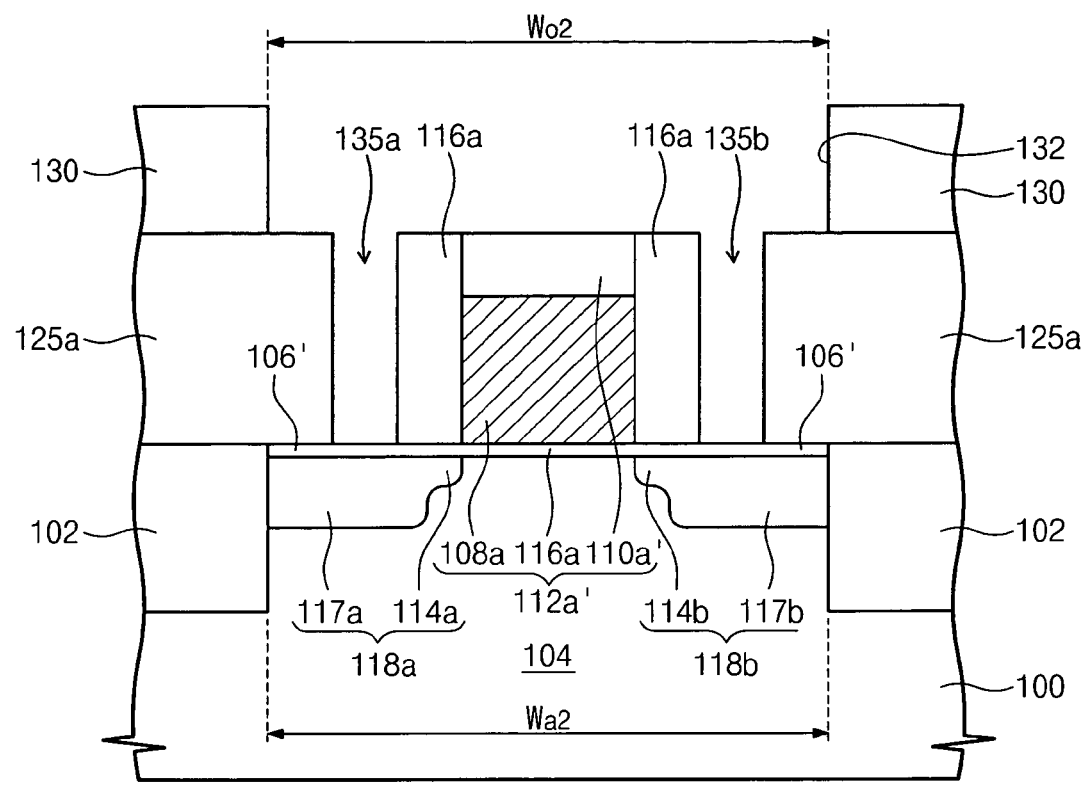
Figure 8B:
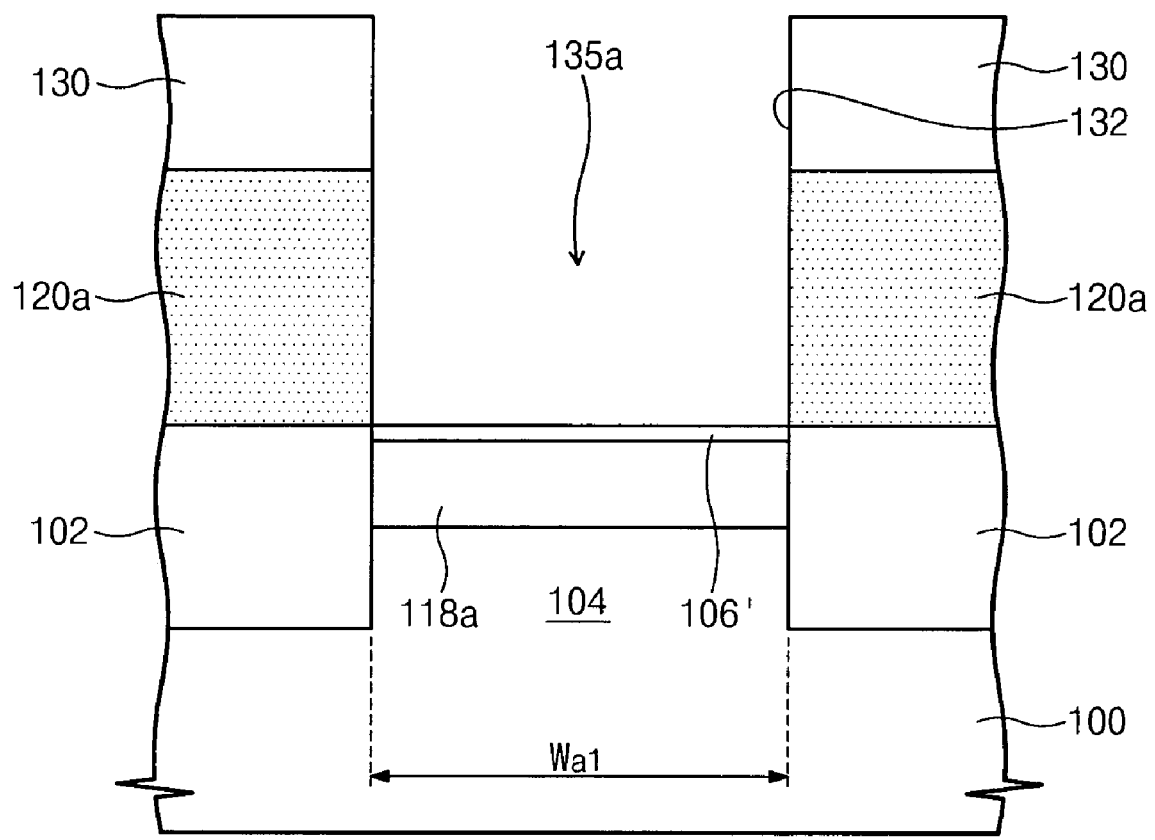

As seen in FIGS. 8A and 8B, the exposed first and second portions of the sacrificial spacer 120a are removed using the mask pattern 130 as an etch mask to form first and second grooves 135a and 135b, respectively. The sacrificial spacer 120a has an etch selectivity with respect to the gate spacer 116a, the interlayer dielectric 125a, and the capping insulating pattern 110a', in order for selectively removing the exposed the first and second portions of the sacrificial spacer 120a. When the first and second portions of the sacrificial spacer 120a are selectively removed, the third portion of the sacrificial spacer 120a on the device isolation pattern 102 remains. The exposed first and second portions of the sacrificial spacer 120a can be removed by means of anisotropic etch. In this example, a longitudinal width of the gate pattern 112a' of the first and second grooves 135a and 135b can be equal to the first width Wa1 of the active region 104.

Alternatively, the exposed first and second portions of the sacrificial spacer 120a can be removed by means of isotropic etch. In this example, a longitudinal width of the gate pattern 112a' of the gate pattern 112a of the first and second grooves 135a and 135b may be greater than the first width Wa1 of the active region 104. In case the exposed first and second portion of the sacrificial spacer 120a are removed by means of isotropic etch, at least a part of the third portion of the sacrificial spacer 120a on the device isolation pattern 102 remains. Alternatively, the exposed first and second portions of the sacrificial spacer 120a can be removed by sequentially performing an anisotropic etch and an isotropic etch.

In an exemplary embodiment, in case the buffer insulating layer 106' on the first source/drain 118a and the second source/drain 118b are omitted, the first groove 135a and the second groove 135b can be formed to expose the first source/drain 118a and the second source/drain 118b, respectively.

Alternatively, in case the buffer insulating layer 106' is formed, the first groove 135a can be formed to expose the buffer insulator 106' on the first source/drain 118a and the second groove 135b can be formed to expose the buffer insulator 106' on the second source/drain 118b. When the exposed first and second portions of the sacrificial spacer 120a are removed, the buffer insulator 106 can serve to protect the first source/drain 118a and the second source/drain 118b.

Figure 9A:
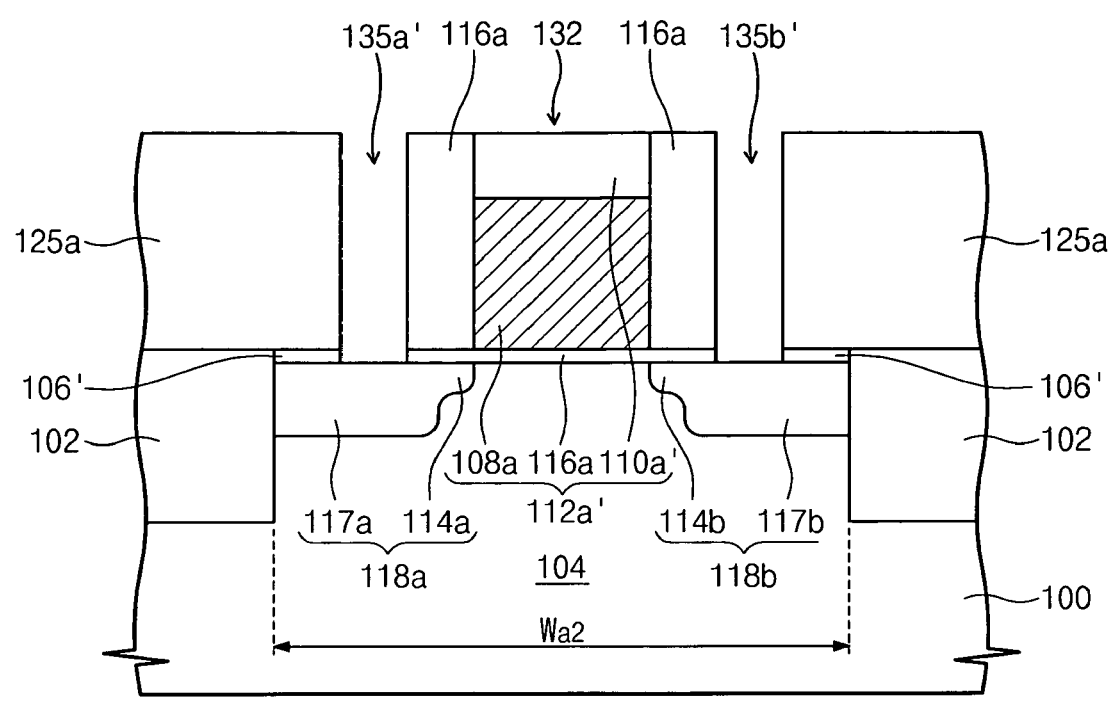
Figure 9B:
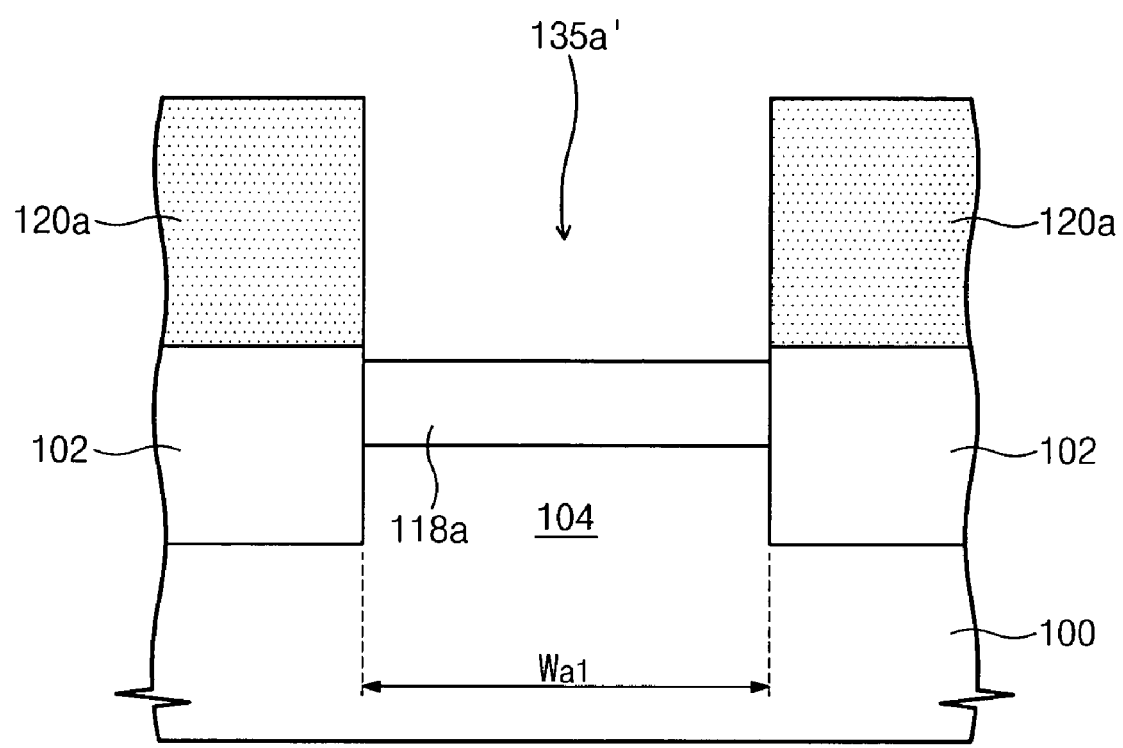

As seen FIGS. 9A and 9B, in case the first and second grooves 135a and 135b are formed to expose the buffer insulator 106', the exposed buffer insulator 106' can be removed. As a result, the first groove 135a' penetrating the buffer insulator 106' can exposes the first source/drain 118a, and the second groove 135b' penetrating the buffer insulator 106' can exposes the second source/drain 118b. The exposed buffer insulator 106' can be removed by means of the wet etch to protect the first source/drain 118a and the second source/drain 118b. In this example, in case the gate spacer 116a and the interlayer dielectric 125a include oxide, the gate spacer 116a and the interlayer dielectric 125a can be partially removed. Thus, the widths of the first and second grooves 135a' and 135b' may increase in the latitudinal direction of the gate pattern 112a'.

In a way of processing, the mask pattern 130 is removed. The mask pattern 130 can be removed before or after removal of the exposed buffer insulator 106'.

Figure 10A:
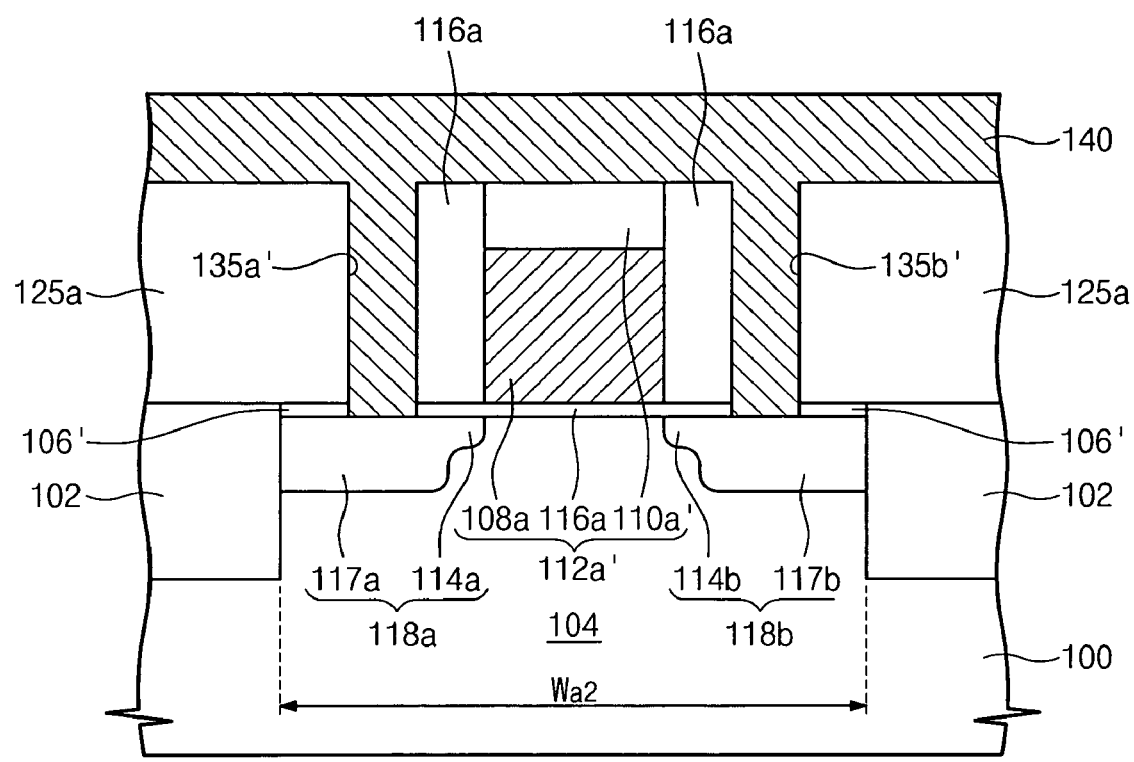
Figure 10B:
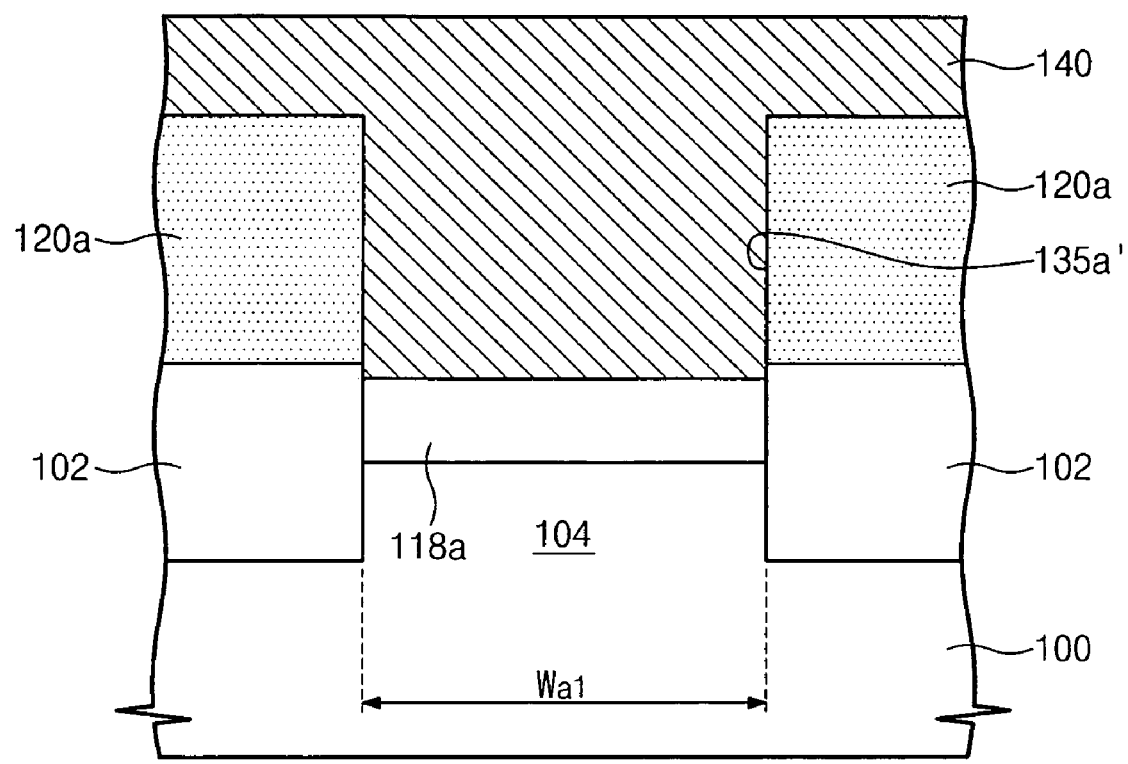

As seen in FIGS. 10A and 10B, a conductive layer is formed on the entire surface of the substrate 100 to fill the first and second grooves 135a' and 135b'. The conductive layer is planarized down to top surfaces in a way of the gate spacer 116a, the interlayer dielectric 125a, and the capping insulating pattern 110a', for forming a first contact structure 140a to fill the first groove 135a' and a second contact structure 140b to fill the second groove 135b'. When the conductive layer is planarized, upper portions of the capping insulating pattern 110a', the interlayer dielectric 125a, and the gate spacer 116a can be planarized to allow the top surfaces of the capping insulating pattern 110a', the interlayer dielectric 125a, and the gate spacer 116a to be coplanar with one another. The planarization of the conductive layer can be done by means of at least of a chemical mechanical polishing (CMP) process and or an etch-back process.

Returning to the FIGS. 1A through C, first and second top conductors 142a and 142b are formed to achieve contact structure of a semiconductor device of FIGS. 1A through 1C.

According to various embodiments of the invention, the first and second grooves 135a' and 135b' can be formed by selectively removing portions of the sacrificial spacer 120a having an etch selectivity with respect to the gate spacer 116a and the interlayer dielectric 125a. As such, the first and second grooves 135a' and 135b' can be formed to be self-aligned with the gate spacer 116a. As a result, this yields the advantageous effect of distances between the first and second contact structures 140a and 140b and the gate pattern 112a' that can be reproducibly provided to achieve a highly reliable semiconductor device.

Each of the first and second contact structures 140a and 140b provides a bar-shaped pattern extending in the longitudinal direction of the gate pattern 112a'. As a result, it is possible to reduce distance variation based on a position between a channel region below the gate pattern 112a' and the respective contact structures 140a and 140b. Namely, this also yields the advantages effect of a MOS transistor having optimized contact structure to provide characteristic of increased amount of turn-on current that is formed yet achieving a reliable and reproducible semiconductor device required for high density processing.

The first and second grooves 135a' and 135b' can be formed using the opening 132 having the width Wo1 that can be equal to the first width Wa1 of the active region 104. Accordingly, in the longitudinal direction of the gate pattern 112a', the first and second contact structures 140a and 140b have widths each being equal to or greater than the first width Wa1 of the active region 104. This makes a distance between the channel region and the respective contact structures 140a and 140b uniform substantially throughout a channel width. As a result, it is contemplated that a semiconductor device including a MOS transistor having increased amount of high turn-on current can be achieved.

FIGS. 11A through 13A are cross-sectional views taken along the line III-III' of FIG. 2A to explain a an exemplary method of forming the semiconductor device of FIGS. 2A and 2B, and FIGS. 11B through 13B are cross-sectional views taken along the line IV-IV' of FIG. 2A to explain a method of forming the semiconductor device of FIGS. 2A and 2B.

Figure 11A:
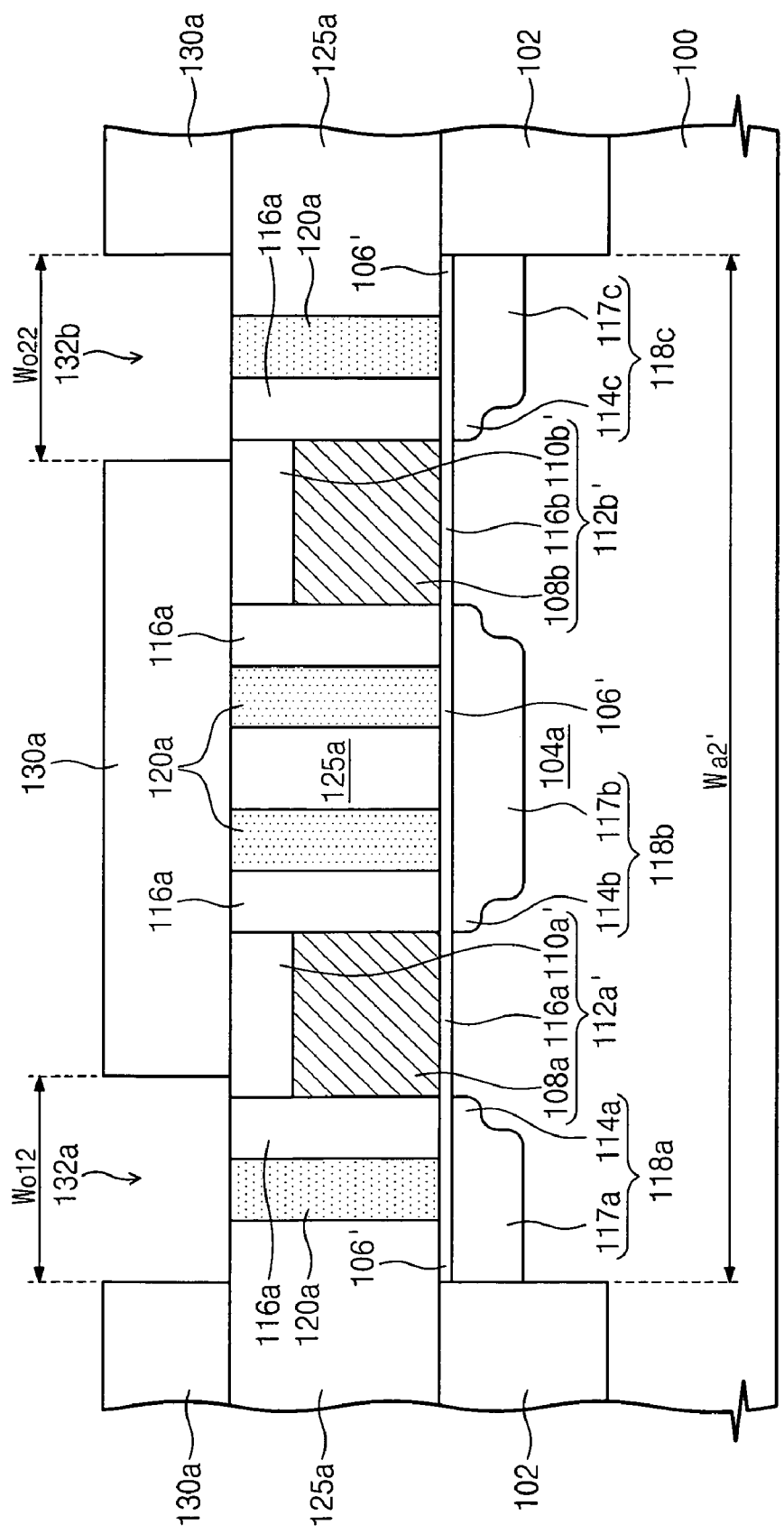
Figure 11B:
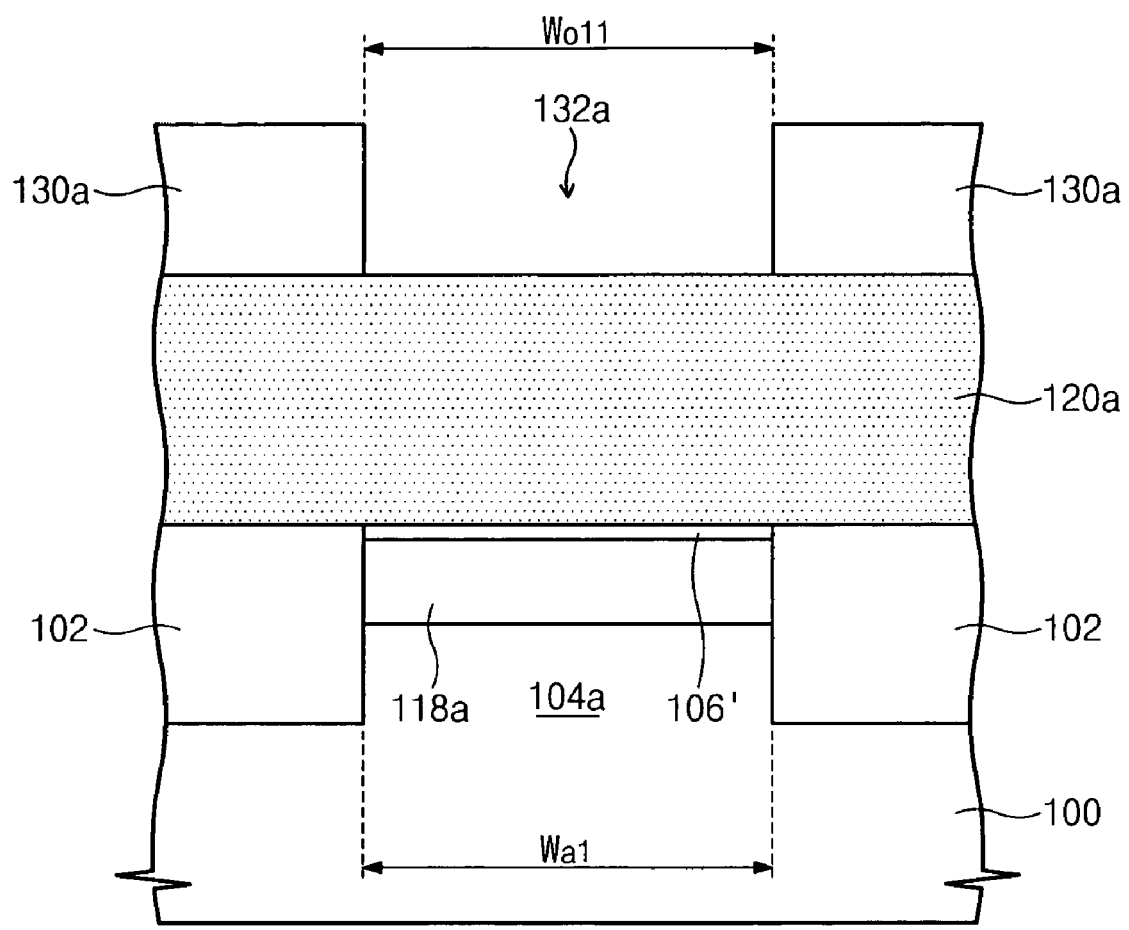

In distinguishing method as shown in FIGS. 2A and 2B for forming a device isolation pattern, according to an exemplary embodiment, FIGS. 11A and 11B provides first and second gate patterns 112a' and 112b' that are disposed to cross an active region 104a defined by the device isolation pattern 102 and also disposed on the device isolation pattern 102. The active region 104a has a first width Wa1 in a longitudinal direction of the gate patterns 112a' and 112b' and a second width Wa2' in a latitudinal direction thereof. A first source/drain 118a can be formed in an active region 104a adjacent to one side of the first gate pattern 112a', a second source/drain 118b can be formed in an active region 104a between the first and second gate patterns 112a' and 112b', and a third source/drain 118c can be formed in an active region adjacent to one side of the second gate pattern 112b'. A gate spacer 116a and a sacrificial spacer 120a are sequentially stacked on both sidewalls of the first and second gate patterns 112a' and 112b'.

When an interlayer dielectric is planarized, upper portions of the gate spacer 116a and first and second capping insulating patterns 110a' and 110b' included in the first and second gate patterns 112a' and 112b' can be planarized.

A mask pattern 130a with a first opening 132a and a second opening 132b is formed on the planarized interlayer dielectric 125a. The mask pattern 130a can be formed of photoresist. The first opening 132a is formed to expose a first portion of the sacrificial spacer 120a disposed on the first source/drain 118a. The mask pattern 130a can cover second portions of the sacrificial spacer 120a disposed on the second source/drain 118b. The second portions of the sacrificial spacer 120a can be disposed on left or right sidewalls of the first and second gate patterns 112a' and 112b' adjacent to the second source/drain 118a, respectively. The second opening 132b can be formed to expose a third portion of the sacrificial spacer 120a disposed on the third source/drain 118c. The mask pattern 130a can covers a fourth portion of the sacrificial spacer 120a disposed on the device isolation pattern 102.

The first opening 132a has a first width Wo11 in a longitudinal direction of the first gate pattern 112a' and a second width Wo12 in a latitudinal direction thereof. As mentioned, the latitudinal direction of the gate pattern 112a' is perpendicular to the longitudinal direction thereof. The first width Wo11 of the first opening 132a can be equal to the first width Wa1 of the active region 104a. In the latitudinal direction of the first gate pattern 112a', the second width Wo12 of the first opening 132a can be greater than the width of the exposed first portion of the sacrificial spacer 120a. Thus, the first opening 132a may expose portions of the gate spacer 116a and the interlayer dielectric 125a which are adjacent to the exposed first portion of the sacrificial spacer 120a. The first opening 132a can be aligned on the active region 104a within an alignment margin of a photolithography process between the first opening 132a and the active region 104a.

By way of example, the second opening 132b has a first width in a longitudinal direction of the second gate pattern 112b' and a second width Wo22 in a latitudinal direction thereof. The longitudinal and latitudinal directions of the second gate pattern 112b' can be identical to those of the first gate pattern 112a', respectively. The first width of the second opening 132b can be equal to the first width Wa1 of the active region 104a. In the latitudinal direction of the second gate pattern 112b', the second width Wo22 of the second opening 132b can be greater than the width of the exposed second portion of the sacrificial spacer 120a. Thus, the second opening 132b can also expose portions of the gate spacer 116a and the interlayer dielectric 125a which are adjacent to the exposed second portion of the sacrificial spacer 120a. The second opening 132b can be aligned on the active region 104a within an alignment margin of a photolithography process between the second opening 132b and the active region 104a.

Figure 12A:
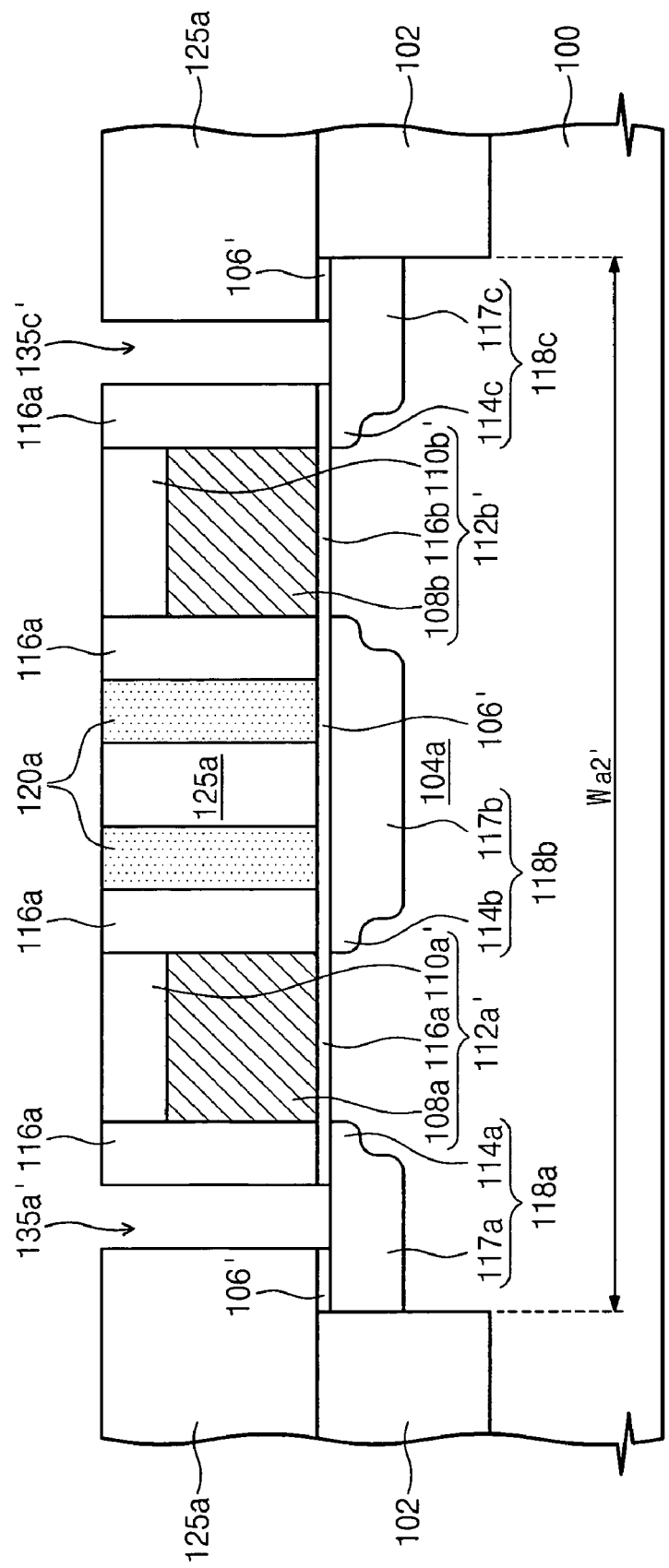
Figure 12B:
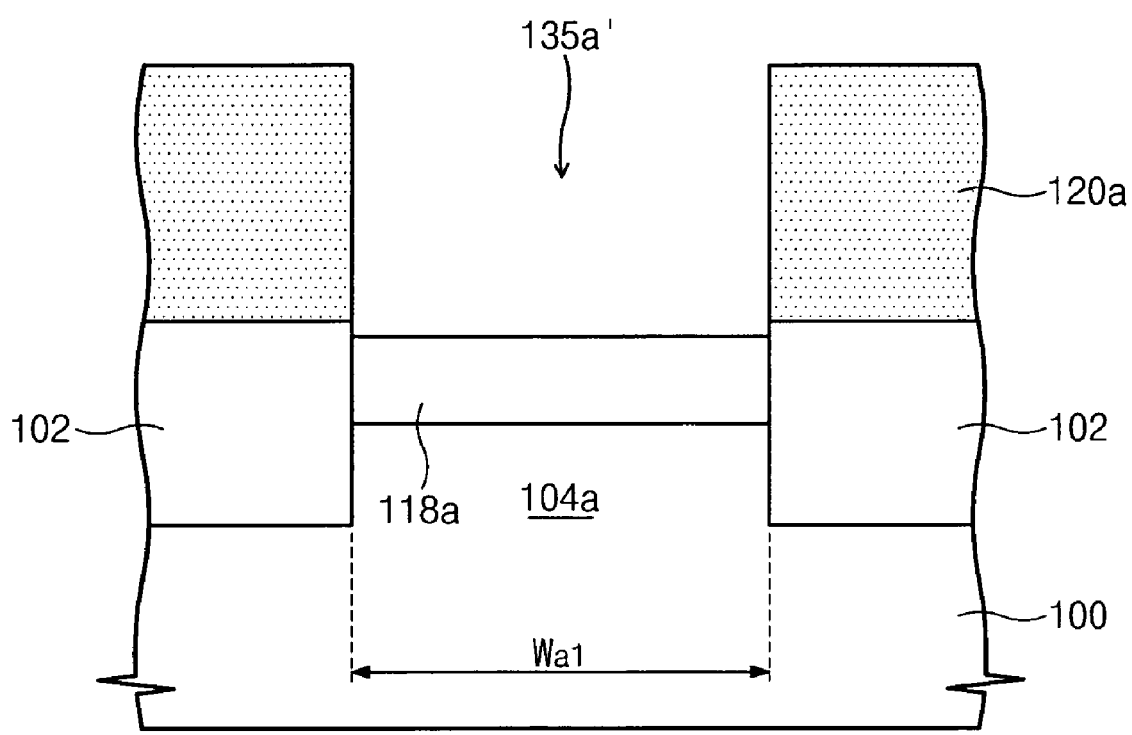

As seen in FIGS. 12A and 12B, the exposed first and third portions of the sacrificial spacer 120a can removed using the mask pattern 130a as an etch mask to form a first groove 135a' and a second groove 135c'. In case a buffer insulator 106' is not disposed on the first source/drain 118a, the second source/drain 118b, and the third source/drain 118c, the first groove 135a' and the second groove 135c' can expose the first source/drain 118a and the third source/drain 118c, respectively. Meanwhile, in case a buffer insulator 106' is formed on the first source/drain 118a, the second source/drain 118b, and the third source/drain 118c, the buffer insulator 106 can be removed following removal of the exposed first and second portions. Thus, the first groove 135a and the second groove 135c can expose the first source/drain 118a and the second source/drain 118c, respectively.

Following formation of the first and second grooves 135a' and 135c', second and fourth portions of the sacrificial spacer 120a are allowed to remain. The exposed first and third portions of the sacrificial spacer 120a can be removed by means of at least one of anisotropic etch and isotropic etch. The buffer insulator 106' may be removed by means of wet etch.

Figure 13A:
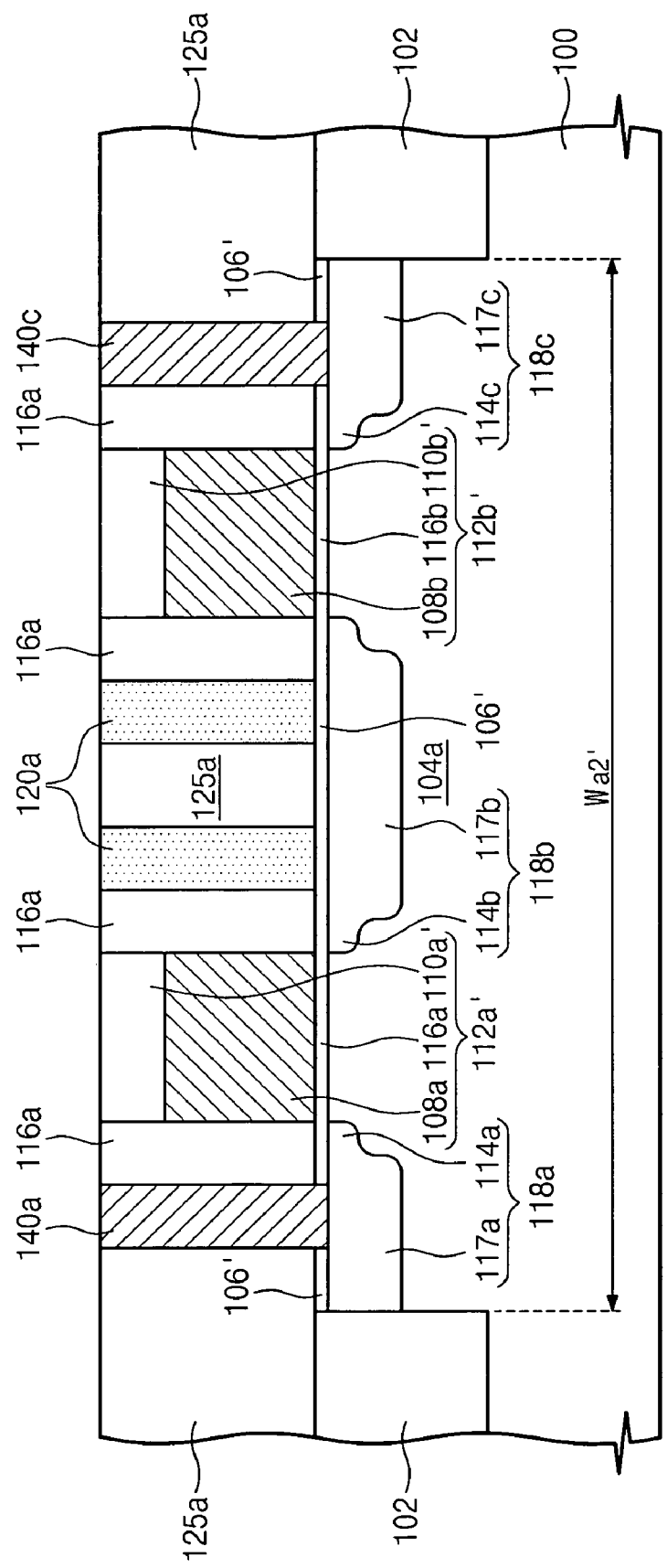
Figure 13B:
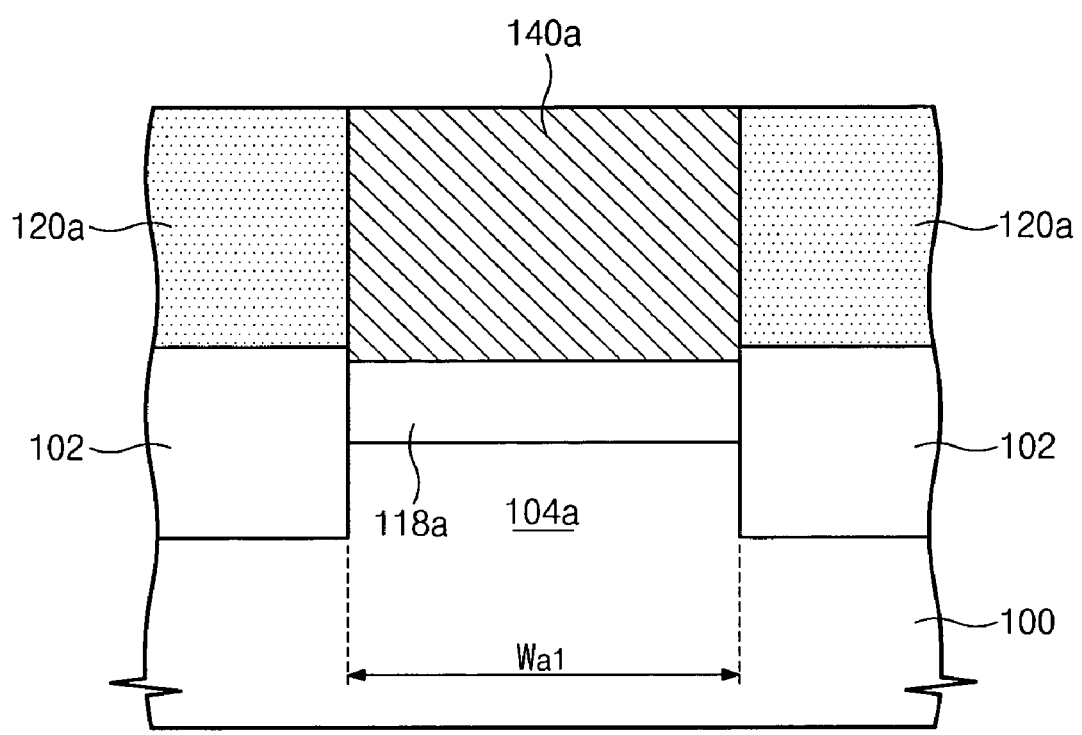

As seen in FIGS. 13A and 13B, a conductive layer is formed on the entire surface of the substrate 100 to fill the first and second grooves 135a' and 135c'. The conductive layer can be planarized down to top surfaces in a way of the sacrificial spacer 120a, the gate spacer 116a, the interlayer dielectric 125a, and the capping insulating patterns 110a' and 110b', to form first and second contact structures 140a and 140c to fill the first and second grooves 135a' and 135c', respectively. When the conductive layer is planarized, upper portions of the sacrificial spacer 120a, the gate spacer 116a, the interlayer dielectric 125a, and the capping insulating patterns 110a' and 110b' can be planarized. As a result, the top surfaces of the sacrificial spacer 120a, the gate spacer 116a, the interlayer dielectric 125a, and the capping insulating patterns 110a' and 110b' can be coplanar with one another.

Following these steps, first and second upper conductors 142a and 142c of FIGS. 2A and 2B can be formed to achieve a semiconductor device of FIGS. 2A and 2B.

As noted, a contact structure contacting a first source/drain can be disposed in a groove defined by a gate spacer and an interlayer dielectric and provides bar-shaped pattern extending in a longitudinal direction of a gate pattern. As a result, it is possible to reduce distance variation based on a position between the contact structure and a channel region below the gate pattern. That is, since the contact structure provides bar-shaped pattern extending the longitudinal direction of the gate pattern, a distance between the contact structure and the edge of the channel region adjacent to the device isolation pattern can be reduced. Accordingly, the distance between the contact structure and the edge of the channel region and the distance between the central portion of the channel region and the contact structure can be reduced to achieve lower resistance between the channel region and the contact structure. As a result, the amount of turn-on current of a MOS transistor is extended to achieve a high-performance and a high-density semiconductor device.

In addition, the distance between the contact structure and the gate pattern can be determined by the gate spacer. Namely, the contact structure can be self-aligned with the gate spacer. Thus, the distance between the contact structure and the channel region can be reliable and reproducible to achieve a highly reliable semiconductor device.

Furthermore, forming a groove includes sequentially forming a gate spacer and a sacrificial spacer on a sidewall of the gate pattern and removing a portion of the sacrificial spacer. Thus, the distance between the gate pattern and a contact structure formed in the groove is can be self-aligned enables to making reproducible semiconductor device optimized for high density.

According to yet another exemplary embodiment, in the longitudinal direction of the gate pattern, a width of the contact structure can be equal to or greater than that of an active region where the first source/drain is formed. In this case, the contact structure can be in contact with the entire width of the first source/drain in the longitudinal direction of the gate pattern. As resulted, the distance between the contact structure and the edge of the channel region can be equal to that between the contact structure and a central portion of the channel region. Therefore, turn-on current can be an output substantially through the contact structure and the entire width of the channel region.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A method of forming a semiconductor device, comprising:
    forming a gate pattern on a substrate including a device isolation pattern provided to define an active region, the gate pattern crossing over the active region and being disposed on the device isolation pattern;
    forming a first doped region and a second doped region in the active region adjacent to opposite sides of the gate pattern, respectively;
    sequentially forming a gate spacer and a sacrificial spacer on both sidewalls of the gate pattern;
    forming an interlayer dielectric on the entire surface of the substrate;
    planarizing the interlayer dielectric to expose the gate spacer and the sacrificial spacer;
    removing a portion of the sacrificial spacer to form a groove to expose the first doped region, forming the groove including:
        forming a mask pattern with an opening on the substrate, the opening being provided to expose a portion of the sacrificial spacer disposed on the first doped region and the mask pattern covering another portion of the sacrificial spacer disposed on the device isolation pattern; and
        removing the exposed portion of the sacrificial spacer by using the mask pattern as an etch mask; and
    forming a contact structure in the groove.

2. The method of claim 1, wherein the opening has a first width in a longitudinal direction of the gate pattern, and the first width of the opening is equal to a width of the active region, where the first doped region is formed, in the longitudinal direction.

3. The method of claim 2, wherein the opening has a second width in a latitudinal direction that is perpendicular to the longitudinal direction of the gate pattern and the second width of the opening is greater than a width of the sacrificial spacer in the latitudinal direction; and
    wherein the opening further exposes a portion of the gate spacer and a portion of the planarized interlayer dielectric adjacent to both sides of the exposed portion of the sacrificial spacer.

4. The method of claim 2, wherein the mask pattern covers yet another portion of the sacrificial spacer disposed on the second doped region.

5. The method of claim 1, further comprising:
    removing another portion of the sacrificial spacer disposed on the second doped region to form a second groove to expose the second doped region; and
    forming a second contact structure in the second groove.

6. The method of claim 5, wherein
    the opening of the mask pattern further exposes another portion of the sacrificial spacer disposed on the second doped region, and
    wherein removing the exposed portion of the sacrificial spacer includes removing the exposed portions of the sacrificial spacer by using the mask pattern as the etch mask.

7. The method of claim 6, wherein the opening has a first width in a longitudinal direction of the gate pattern, the active region has a first width in the longitudinal direction, and the first width of the opening is equal to the first width of the active region.

8. The method of claim 7, wherein the opening has a second width in a latitudinal direction that is perpendicular to the longitudinal direction of the gate pattern, the active region has a second width in the latitudinal direction, and the second width of the opening is equal to the second width of the active region.

9. The method of claim 1, wherein the sacrificial spacer includes an insulating material having an etch selectivity with respect to the gate spacer and the interlayer dielectric,
    wherein the opening of the mask pattern further exposes a portion of the gate spacer and a portion of the planarized interlayer dielectric adjacent to the exposed portion of the sacrificial spacer, and
    wherein, while the exposed portion of the sacrificial spacer is removed, the exposed portions of the gate spacer and the planarized interlayer dielectric remain.

10. The method of claim 1, wherein the gate pattern comprises a gate electrode and a capping insulating pattern that are sequentially stacked;
    wherein an upper portion of the gate spacer, an upper portion of the sacrificial spacer, and an upper portion of the capping insulating pattern are planarized when the interlayer dielectric is planarized; and
    wherein the sacrificial spacer includes an insulating material having an etch selectivity with respect to the gate spacer, the interlayer dielectric, and the capping insulating pattern.

11. The method of claim 1, further comprising:
    before forming the sacrificial spacer, forming a buffer insulator on the first doped region and the second doped region,
    wherein forming the grooving further includes removing the buffer insulator below a removed portion of the sacrificial spacer.

* * * * *